(12) United States Patent
Zhang

(10) Patent No.: US 11,522,532 B2
(45) Date of Patent: Dec. 6, 2022

(54) TURN-OFF PROTECTION CIRCUIT FOR A SWITCH UNIT AND ASSOCIATED TURN-OFF PROTECTION METHOD

(71) Applicant: Chengdu Monolithic Power Systems Co., Ltd., Chengdu (CN)

(72) Inventor: Jian Zhang, Chengdu (CN)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 385 days.

(21) Appl. No.: 16/991,191

(22) Filed: Aug. 12, 2020

(65) Prior Publication Data

US 2021/0050849 A1 Feb. 18, 2021

(30) Foreign Application Priority Data

Aug. 14, 2019 (CN) .......................... 201910748852.1

(51) Int. Cl.
*H03K 17/0814* (2006.01)
(52) U.S. Cl.
CPC .............................. *H03K 17/0814* (2013.01)
(58) Field of Classification Search
CPC ..................... H03K 17/0814; H03K 17/08142
See application file for complete search history.

(56) References Cited

U.S. PATENT DOCUMENTS

| | | | | |
|---|---|---|---|---|
| 11,444,527 B2* | 9/2022 | Li | .......................... | H02M 1/083 |
| 2011/0018515 A1* | 1/2011 | McCloy-Stevens | ........................ | |
| | | | | H02M 3/1588 |
| | | | | 323/284 |
| 2017/0040883 A1* | 2/2017 | Hu | ........................ | H02M 3/156 |
| 2017/0288545 A1* | 10/2017 | Yamada | ................ | H02M 3/158 |
| 2017/0302178 A1* | 10/2017 | Bandyopadhyay | .. | H03K 17/284 |
| 2020/0049569 A1* | 2/2020 | Arens | ..................... | H01L 23/34 |
| 2020/0355745 A1* | 11/2020 | Bogus | .................. | H02H 7/0833 |
| 2021/0384829 A1* | 12/2021 | Li | .......................... | H02M 1/08 |
| 2022/0181867 A1* | 6/2022 | Cao | ..................... | H02H 1/0007 |

FOREIGN PATENT DOCUMENTS

GB 2472115 A * 1/2011 .......... H02M 3/1588

* cited by examiner

*Primary Examiner* — Sisay G Tiku
(74) *Attorney, Agent, or Firm* — Perkins Coie LLP

(57) ABSTRACT

A turn-off protection circuit and a turn-off protection method for a switch unit. The switch unit may include a first set of switching devices coupled between a first circuit node and an output node, and a second set of switching devices coupled between a second circuit node and the output node. The turn-off protection circuit may compare a first circuit node potential at the first circuit node and/or a second circuit node potential at the second circuit node with a switch node potential at the output node to detect a the flow direction of the a freewheeling current when the switch unit is turned off, and turn on and maintain the first set of switching devices or the second set of switching devices on depending on the flow direction of the freewheeling current until the freewheeling current is reduced to a predetermined safe current threshold.

17 Claims, 11 Drawing Sheets

TURN-OFF PROTECTION CIRCUIT FOR A SWITCH UNIT AND ASSOCIATED TURN-OFF PROTECTION METHOD

CROSS-REFERENCE TO RELATED APPLICATION(S)

This application claims the benefit of CN application No. 201910748852.1 filed on Aug. 14, 2019 and incorporated herein by reference.

TECHNICAL FIELD

This disclosure relates generally to electrical circuit, and more particularly but not exclusively relates to turn-off protection for switch unit including switching devices.

BACKGROUND

Switching device can be widely used in a variety of applications, for instance, to adjust power transmission by controlling the on and off switching of the switching device. For example, in a motor driving circuit, corresponding to each phase of the motor, a high-side switching device and a low-side switching device coupled in series to a power supply terminal may be provided. When any one phase of the motor needs to be turned off, the high-side switching device and the low-side switching device corresponding to that phase usually need to be switched from on to off. For this situation, current originally circulated through the high-side switching device or the low-side switching device can only freewheel through a body diode of the high-side switching device or a body diode of the low-side switching device. However, for those applications such as motor driving where the normal operating current is relatively large, once the switching devices are switched from on to off, only freewheeling the large operating current through the body diodes of the switching devices will lead to excessive power consumption, overheating, mis-conduction of parasitic devices, and or other undesirable problems such as hole/electron injection to the circuit substrate that may even cause circuit damage etc. In addition to the motor driving circuits exemplified here, there are many other applications with switching devices handling relatively large normal operating currents, such as audio amplifier driving circuits, power converters with high power or high current specifications, and so on.

SUMMARY

There has been provided, in accordance with an embodiment of the present invention, a switch unit turn-off protection circuit for a switch unit. The switch unit may comprise a first set of switching devices coupled between a first circuit node and an output node, and a second set of switching devices coupled between the output node and a second circuit node. The switch unit turn-off protection circuit may comprise a freewheeling direction detecting circuit and a freewheeling mode regulating circuit. The freewheeling direction detecting circuit may be configured to compare a switch node potential at the output node with a first circuit node potential at the first circuit node to provide a first determination signal, and further configured to turn on the first set of switching devices if the switch node potential is higher than the first circuit node potential, and to turn on the second set of switching devices if the switch node potential is lower than the first circuit node potential. The freewheeling mode regulating circuit may be configured to detect a first freewheeling current flowing through the first set of switching devices, and further configured to turn off the first set of switching devices when the first freewheeling current is lower than a first predetermined safe current threshold, and further configured to detect a second freewheeling current flowing through the second set of switching devices, and further configured to turn off the second set of switching devices when the second freewheeling current is lower than a second predetermined safe current threshold.

In accordance with an embodiment, the freewheeling direction detecting circuit may comprise a first comparison circuit, having a first input terminal configured to receive a switch node potential indication signal that is indicative of the switch node potential, a second input terminal configured to receive a first node potential indication signal that is indicative of the first circuit node potential, and an output terminal, wherein the first comparison circuit is configured to compare the switch node potential indication signal with the first node potential indication signal to provide the first determination signal.

In accordance with an embodiment, the freewheeling direction detecting circuit is coupled to the second circuit node in place of the first circuit node, and is configured to compare the switch node potential with a second circuit node potential at the second circuit node to provide a second determination signal, and wherein the freewheeling direction detecting circuit is further configured to turn on the first set of switching devices if the switch node potential is higher than the second circuit node potential, and to turn on the second set of switching devices if the switch node potential is lower than the second circuit node potential.

In accordance with an embodiment, the freewheeling direction detecting circuit may comprise a second comparison circuit, having a first input terminal configured to receive a switch node potential indication signal that is indicative of the switch node potential, a second input terminal configured to receive a second node potential indication signal that is indicative of the second circuit node potential, and an output terminal, wherein the second comparison circuit is configured to compare the switch node potential indication signal with the second node potential indication signal to provide the second determination signal.

In accordance with an embodiment, the freewheeling direction detecting circuit and the freewheeling mode regulating circuit are enabled when the switch unit is turned off.

In accordance with an embodiment, the freewheeling direction detecting circuit is coupled to both the first circuit node and the second circuit node, and is configured to compare the switch node potential respectively with the first circuit node potential and second circuit node potential to respectively provide a first determination signal and a second determination signal, and is further configured to turn on the first set of switching devices if the switch node potential is higher than the first circuit node potential, and instead of turning on the second set of switching devices if the switch node potential is lower than the first circuit node potential, the freewheeling direction detecting circuit is further configured to turn on the second set of switching devices if the switch node potential is lower than the second circuit node potential.

In accordance with an embodiment, the freewheeling direction detecting circuit may comprise the first comparison circuit and the second comparison circuit.

In accordance with an embodiment, the freewheeling mode regulating circuit may comprise: a first freewheeling regulating circuit, coupled to the first set of switching devices, and configured to detect the first freewheeling current and to compare the first freewheeling current with the first predetermined safe current threshold to provide a first turn-off signal, wherein when the first freewheeling current is lower than the first predetermined safe current threshold, the switch unit turn-off protection circuit is configured to turn off the first set of switching devices in response to the first turn-off signal; and a second freewheeling regulating circuit, coupled to the second set of switching devices, and configured to detect the second freewheeling current and to compare the second freewheeling current with the second predetermined safe current threshold to provide a second turn-off signal, wherein when the second freewheeling current is lower than the second predetermined safe current threshold, the switch unit turn-off protection circuit is configured to turn off the second set of switching devices in response to the second turn-off signal.

In accordance with an embodiment, the first freewheeling regulating circuit may comprises a first detecting transistor having a first terminal, a second terminal and a control terminal, wherein the first terminal of the first detecting transistor is coupled to the output node, and wherein the control terminal of the first detecting transistor is coupled to a control terminal of the first set of switching devices, and wherein the first detecting transistor is configured to have a first predetermined ratio between an equivalent channel width-to-length ratio of the first set of switching devices and a channel width-to-length ratio of the first detecting transistor, and wherein the first predetermined ratio is positive; a first regulating comparator, having a first input terminal coupled to the second terminal of the first detecting transistor, a second input terminal coupled to the first circuit node, and an output terminal configured to provide the first turn-off signal; and a first current source, coupled to the first input terminal of the first regulating comparator, and configured to adjust a first reference current flowing out of the first input terminal of the first regulating comparator.

In accordance with an embodiment, the second freewheeling regulating circuit may comprise: a second detecting transistor having a first terminal, a second terminal and a control terminal, wherein the first terminal of the second detecting transistor is coupled to the output node, and wherein the control terminal of the second detecting transistor is coupled to a control terminal of the second set of switching devices, and wherein the second detecting transistor is configured to have a second predetermined ratio between an equivalent channel width-to-length ratio of the second set of switching devices and a channel width-to-length ratio of the second detecting transistor, and wherein the second predetermined ratio is positive; a second regulating comparator, having a first input terminal coupled to the second terminal of the second detecting transistor, a second input terminal coupled to the second circuit node, and an output terminal configured to provide the second turn-off signal; and a second current source, coupled to the first input terminal of the second regulating comparator, and configured to adjust a second reference current flowing into the first input terminal of the second regulating comparator.

In accordance with an embodiment, the first freewheeling regulating circuit may comprise: a first current detection amplifier, having a first input terminal coupled to the first circuit node, and a second input terminal coupled to the output node, wherein the first current detection amplifier is configured to detect the first freewheeling current to provide at an output terminal of the first current detection amplifier a first current detection signal indicative of the first freewheeling current; and a third regulating comparator, having a first input terminal coupled to the output terminal of the first current detection amplifier to receive the first current detection signal, and a second input terminal configured to receive a first threshold signal indicative of the first predetermined safe current threshold, wherein the third regulating comparator is configured to compare the first current detection signal with the first threshold signal to provide the first turn off signal at an output terminal of the third regulating comparator.

In accordance with an embodiment, the second freewheeling regulating circuit may comprise: a second current detection amplifier, having a first input terminal coupled to the second circuit node, and a second input terminal coupled to the output node, wherein the second current detection amplifier is configured to detect the second freewheeling current to provide at an output terminal of the second current detection amplifier a second current detection signal indicative of the second freewheeling current; and a fourth regulating comparator, having a first input terminal coupled to the output terminal of the second current detection amplifier to receive the second current detection signal, and a second input terminal configured to receive a second threshold signal indicative of the second predetermined safe current threshold, wherein the fourth regulating comparator is configured to compare the second current detection signal with the second threshold signal to provide the second turn off signal at an output terminal of the fourth regulating comparator.

In accordance with an embodiment, the switch unit turn-off protection circuit may further comprise: a turn-off detection circuit, configured to detect whether the switch unit is turned off and provide a turn-off indication signal, wherein the freewheeling direction detecting circuit and the freewheeling mode regulating circuit each having an enable terminal configured to receive the turn-off indication signal, wherein the freewheeling direction detecting circuit and the freewheeling mode regulating circuit are enabled when the turn-off indication signal indicates that the switch unit is turned off, else the freewheeling direction detecting circuit and the freewheeling mode regulating circuit are disabled.

In accordance with an embodiment, the turn-off detection circuit is configured to receive a first driving signal, a second driving signal and a system enable signal, and to generate the turn-off indication signal based on the first driving signal, the second driving signal and the system enable signal, and wherein the first driving signal is configured to drive the first set of switching devices, and wherein the second driving signal is configured to drive the second set of switching device, and wherein the system enable signal is configured to indicate whether an application circuit comprising the switch unit is operating.

In accordance with an embodiment, when the system enable signal indicates that the application circuit comprising the switch unit stops operating and the first driving signal and the second driving signal respectively control the first set of switching devices and the second set of switching devices to turn off, the turn-off indication signal indicates that the switch unit is turned off.

In accordance with an embodiment, the switch unit turn-off protection circuit may further comprise: a protection window generation circuit, configured to generate a single pulse signal in response to a transition edge of a system enable signal at which the system enable signal transitions to indicate that an application circuit comprising the switch unit stops operating, wherein the single pulse signal has a predetermined pulse width, and wherein the switch unit turn-off protection circuit is enabled during the pulse width of the single pulse signal, and wherein the switch unit turn-off protection circuit is disabled outside the pulse width of the single pulse signal.

There has also been provided, in accordance with an embodiment of the present invention, a turn-off protection method for a switch unit, comprising a step of detecting a freewheeling direction when the switch unit is turned off, and a step of regulating a freewheeling mode when the switch unit is turned off.

In accordance with an embodiment, the step of detecting the freewheeling direction may use a first detecting method that may comprise: comparing a switch node potential at an output node of the switch unit with a first circuit node potential at a first circuit node; when the switch node potential is higher than the first circuit node potential, turning on a first set of switching devices coupled between the first circuit node and the output node; and when the switch node potential is lower than the first circuit node potential, turning on a second set of switching devices coupled between the output node and a second circuit node.

In accordance with an embodiment, the step of regulating the freewheeling mode may comprise: detecting a first freewheeling current flowing through the first set of switching devices; turning off the first set of switching devices when the first freewheeling current is smaller than a first predetermined safe current threshold; and detecting a second freewheeling current flowing through the second set of switching devices; and turning off the second set of switching devices when the second freewheeling current is smaller than the second predetermined safe current threshold.

In accordance with an embodiment, the step of detecting the freewheeling direction may use a second detecting method instead of the first detecting method, and the second detecting method may comprise: comparing the switch node potential with a second circuit node potential at the second circuit node; turning on the first set of switching devices when the switch node potential is higher than the second circuit node potential; and turning on the second set of switching devices when the switch node potential is lower than the second circuit node potential:

In accordance with an embodiment, the step of detecting the freewheeling direction may use a third detecting method instead of the first and second detecting methods, and the third detecting method may comprise: comparing the switch node potential respectively with the first circuit node potential and a second circuit node potential at the second circuit node; when the switch node potential is higher than the first circuit node potential, turning on the first set of switching devices; and when the switch node potential is lower than the second circuit node potential, turning on the second set of switching devices.

In accordance with an embodiment, the turn-off protection method may further comprise: a step of detecting whether the switch unit is turned off, and providing a turn-off indication signal indicating that the switch unit is turned off.

In accordance with an embodiment, the step of detecting whether the switch unit is turned off may comprise detecting whether the first set of switching devices and the second set of switching devices are both turned off when the application circuit to which the switch unit belongs ends a normal operation process, and the turn-off indication signal indicates that the switch unit is turned off when it is detected that the first set of switching devices and the second set of switching devices are both turned off when the application circuit to which the switch unit belongs ends a normal operation process.

In accordance with an embodiment, the turn-off protection method may further comprise: setting an effective operation window in response to a transition edge of a system enable signal at which the system enable signal transitions to indicate that an application circuit comprising the switch unit stops operating (ends a normal operation process), and executing the steps of detecting the freewheeling direction and regulating the freewheeling mode when the switch unit is turned off within the effective operation window.

BRIEF DESCRIPTION OF THE DRAWINGS

The following detailed description of various embodiments of the present invention can best be understood when read in conjunction with the following drawings, in which the features are not necessarily drawn to scale but rather are drawn as to best illustrate the pertinent features.

DETAILED DESCRIPTION

Various embodiments of the present invention will now be described. In the following description, some specific details, such as example circuits and example values for these circuit components, are included to provide a thorough understanding of the embodiments. One skilled in the relevant art will recognize, however, that the present invention can be practiced without one or more specific details, or with other methods, components, materials, etc. In other instances, well-known structures, materials, processes or operations are not shown or described in detail to avoid obscuring aspects of the present invention.

Throughout the specification and claims, the term "coupled," as used herein, is defined as directly or indirectly connected in an electrical or non-electrical manner. The terms "a," "an," and "the" include plural reference, and the term "in" includes "in" and "on". The phrase "in one embodiment," as used herein does not necessarily refer to the same embodiment, although it may. The term "or" is an inclusive "or" operator, and is equivalent to the term "and/or" herein, unless the context clearly dictates otherwise. The term "based on" is not exclusive and allows for being based on additional factors not described, unless the context clearly dictates otherwise. The term "circuit" means at least either a single component or a multiplicity of components, either active and/or passive, that are coupled together to provide a desired function. The term "signal" means at least one current, voltage, charge, temperature, data, or other signal. Where either a field effect transistor ("FET") or a bipolar junction transistor ("BJT") may be employed as an embodiment of a transistor, the scope of the words "gate", "drain", and "source" includes "base", "collector", and "emitter", respectively, and vice versa. Those skilled in the art should understand that the meanings of the terms identified above do not necessarily limit the terms, but merely provide illustrative examples for the terms.

Figure 1:
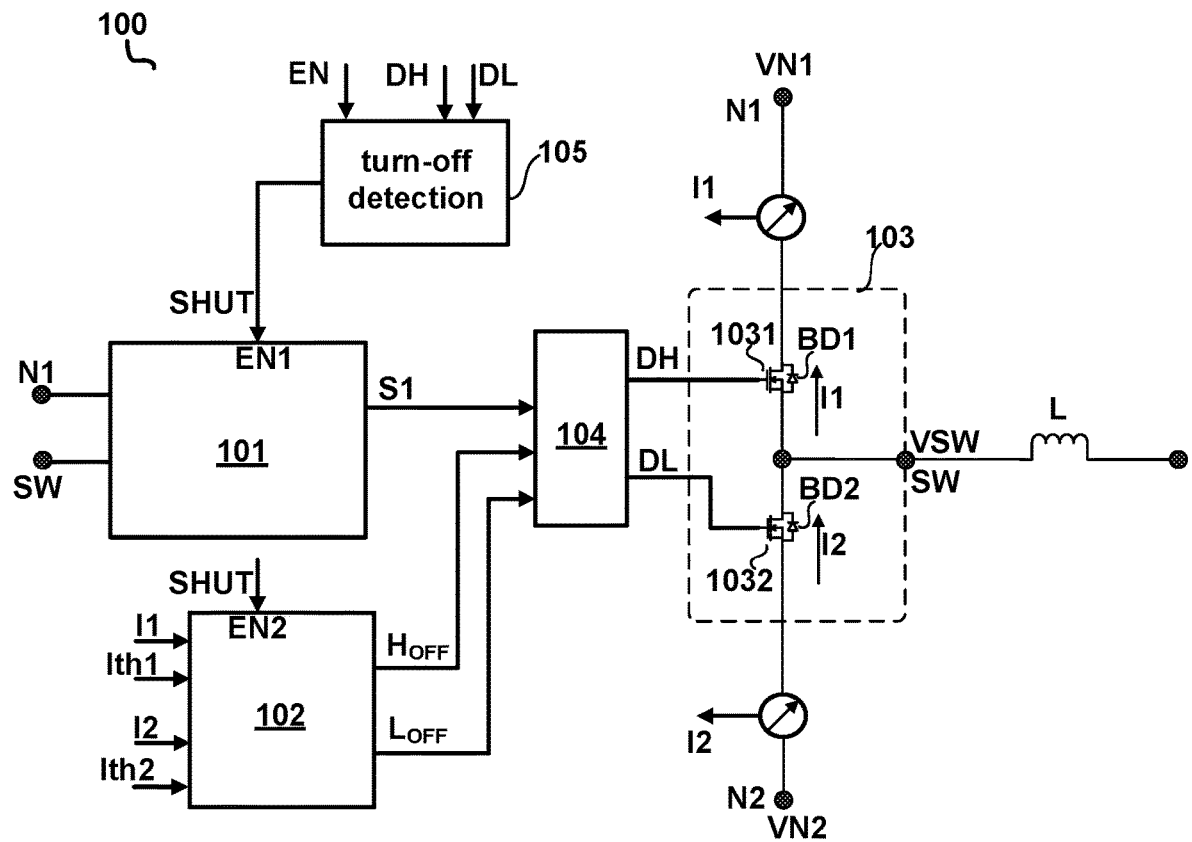
FIG. 1 illustrates a block diagram of a switch unit turn-off protection circuit 100 in accordance with an embodiment of the present invention.

FIG. 1 illustrates a block diagram of a switch unit turn-off protection circuit 100 in accordance with an embodiment of the present invention. The switch unit turn-off protection circuit 100 may comprise a freewheeling direction detecting circuit 101 and a freewheeling mode regulating circuit 102. The freewheeling direction detecting circuit 101 and the freewheeling mode regulating circuit 102 may each have an enable terminal respectively labeled with EN1 and EN2, for receiving a turn-off indication signal SHUT indicative of turn off of a switch unit 103. Those skilled in the art would appreciate that turn off of the switch unit 103 may refer to that switching devices in the switch unit 103 are turned off.

To aid in better understanding of the present disclosure, in the exemplary embodiment of FIG. 1, the switch unit 103 is illustrated to be coupled between a first circuit node N1 and a second circuit node N2. The switch unit 103 may have an output node SW. The switch unit 103 may include a first set of switching devices coupled between the first circuit node N1 and the output node SW, and a second set of switching devices coupled between the second circuit node N2 and the output node SW. The first set of switching devices may include one switching device or a plurality of switching devices coupled in series or in parallel. The second set of switching devices may also include one switching device or a plurality of switching devices coupled in series or in parallel. For the sake of simplicity and clarity, FIG. 1 provides an example where the switch unit 103 is illustrated as comprising a first switching device 1031 and a second switching device 1032, coupled in series between the first circuit node N1 and the second circuit node N2, wherein a common connection of the first switching device 1031 and the second switching device 1032 may be coupled to the output node SW. However, those of ordinary skill in the art should understand that the schematic diagram of FIG. 1 is only exemplary, and is not intended to limit the present disclosure. When the switch unit 103 is turned off, both the first set of switching devices and the second set of switching devices are turned off. If any one of the first set of switching devices or the second set of switching devices is turned on, it can be referred to as the switch unit 103 is turned on. Generally during normal operation, the first set of switching devices and the second set of switching devices are switched on and off alternately in a complementary manner, that is: when the first set of switching devices are turned on, the second set of switching devices are turned off; when the first set of switching devices are turned off, the second set of switching devices are turned on. In order to prevent the first set and the second set of switching devices being turned on at the same time during normal operation, a small safe time (usually referred to as "dead time") during which the first set of the switching devices and the second set of switching devices are both turned off may be introduced/disposed between the complementary switching of the first set of switching devices and the second set of switching devices to avoid short circuit/short through, this case belongs to where the switch unit 103 is turned off during normal operation, hereinafter referred to as "deadtime-off". It may be understood that the switch unit 103 can be considered as switching between on and "deadtime-off" during normal operation. Another situation when the switch unit 103 is turned off (hereinafter simply referred to as "system off") may belong to where a system application circuit which comprising the switch unit 103 should complete with its normal operation process (i.e., stop working, for example, entering into sleep mode or "standby" mode or the entire system application circuit being shutdown, etc.), thereby the switch unit 103 should be shut down and stop switching between on and "deadtime-off" as during the normal operation, but should remain turned off until when the system application circuit is started or turned on again (e.g. the system application circuit needs to enter into the normal working process again).

Those of ordinary skill in the art would appreciate that in typical system application circuits, the switch unit 103 may be coupled to an inductive power storage device L (such as an inductor or a transformer winding etc.) at its output node SW. When the switch unit 103 is on (i.e. the first set of switching devices or the second set of switching device in the switch unit 103 is turned on), a current flows through (including flows into or out of) the output node SW and the inductive power storage device L. When the switch unit 103 is switched from on to off, since the current flowing through the inductive power storage device L should be continuous and cannot be abruptly changed in the flowing direction, the current originally flowing through the inductive power storage device L during the switch unit 103 was on must continue to flow in the original flowing direction once the switch unit 103 is turned off. The process is generally referred to as "freewheeling". Hereinafter, the current flowing through the inductive power storage device L in the "freewheeling" process after the switch unit 103 is turned off is referred to as freewheeling current. If the current flowing through the inductive power storage device L during the switch unit 103 is on is in the direction flowing out of the inductive power storage device L through the output node SW (that is, the direction from the inductive power storage device L to the output node SW), once the switch unit 103 is switched from on to off, the freewheeling current through the inductive power storage device L needs to flow/circulate through one or more body diode(s) of the first set of switching devices (for example, the body diode BD1 of the first switching device 1031 shown in FIG. 1). For the sake of brevity, the freewheeling current needing to continue to circulate in the direction from the inductive power storage device L to the output node SW (that is, through the one or more body diode(s) of the first set of switching devices) may be referred to as the first freewheeling current I1. If the current flowing through the inductive power storage device L during the switch unit 103 is on is in the direction flowing into the inductive power storage device L through the output node SW (that is, the direction from the output node SW to the inductive power storage device L), once the switch unit 103 is switched from on to off, the freewheeling current through the inductive power storage device L needs to flow/circulate through one or more body diode(s) of the second set of switching devices (for example, the body diode BD2 of the second switching device 1032 shown in FIG. 1). For the sake of brevity, the freewheeling current needing to continue to circulate in the direction from the output node SW to the inductive power storage device L (that is, through the one or more body diode(s) of the second set of switching devices) may be referred to as the second freewheeling current I2.

As has been mentioned in the background section, for applications where the normal operating current is relatively large (that is, the current circulating through the switch unit 103 and the inductive power storage device L is relatively large during the switch unit 103 is on), once the switch unit 103 is switched from on to off, the freewheeling current is relatively large and freewheeling such a relatively large current only through the body diode(s) of the switching devices in the switch unit 103 (for example, through the body diode(s) of the first set of switching devices or the body diode(s) of the second set of switching devices) may lead to undesirable problems. The switch unit turn-off protection circuit 100 according to an embodiment of the present disclosure may be configured to firstly detect, for example, by the freewheeling direction detecting circuit 101, whether the freewheeling current is flowing in the direction from the inductive power storage device L to the output node SW or from the output node SW to the inductive power storage device L when the switch unit 103 is turned off. If the switch unit turn-off protection circuit 100 detects that the freewheeling current is flowing in the direction from the inductive power storage device L to the output node SW, the switch unit turn-off protection circuit 100 may be configured to turn on the first set of switching devices in the switch unit 103 instead of the body diode(s) to circulate the first freewheeling current I1 until it is detected (for example, by the freewheeling mode regulating circuit 102) that the first freewheeling current I1 is reduced to a first preset/predetermined safe current threshold Ith1 or the first set of switching devices is maintained on for a first preset/predetermined conduction time TD1. Thereafter, the first set of switching devices may be turned off, and then the relatively safe first freewheeling current I1 will continue to flow/circulate through one or more body diode(s) of the first set of switching devices until the freewheeling ends (for example, the first freewheeling current I1 is reduced to zero). If the switch unit turn-off protection circuit 100 detects that the freewheeling current is flowing in the direction from the output node SW to the inductive power storage device L, the switch unit turn-off protection circuit 100 may be configured to turn on the second set of switching devices in the switch unit 103 instead of the body diode(s) to circulate the second freewheeling current I2 until it is detected (for example, by the freewheeling mode regulating circuit 102) that the second freewheeling current I2 is reduced to a second preset/predetermined safe current threshold Ith2 or the second set of switching devices is maintained on for a second preset/predetermined conduction time TD2. Thereafter, the second set of switching devices will be turned off, and then the relatively safe second freewheeling current I2 will continue to flow/circulate through one or more body diode(s) of the second set of switching devices until the freewheeling ends (for example, the second freewheeling current I2 is reduced to zero). Therefore, the switch unit turn-off protection circuit 100 according to an embodiment of the present disclosure can turn on the first set of switching devices or the second set of switching devices based on the direction of the freewheeling current when the switch unit 103 is turned off to handle relatively large freewheeling current (e.g., the first freewheeling current I1 that is greater than the first preset/predetermined safe current threshold Ith1 or the second freewheeling current I2 that is greater than the second preset/predetermined safe current threshold Ith2), thereby improving the freewheeling current processing capability, reducing power consumption, and avoiding undesired occurrence of overheating, mis-conduction of parasitic devices, injection of holes/electrons to the substrate, circuit damage, etc.

According to an exemplary embodiment of the present disclosure, the switch unit turn-off protection circuit 100 may further comprise a control circuit 104 configured to provide a first driving signal DH and a second driving signal DL to the switch unit 103. The first driving signal DH is configured to control the on and off switching of the first set of switching devices (for example, the first switching device 1031 illustrated in FIG. 1), and the second driving signal DL is configured to control the on and off switching of the second set of switching devices (for example, the second switching device 1032 shown in FIG. 1).

According to an exemplary embodiment of the present disclosure, the switch unit turn-off protection circuit 100 may further comprise a turn-off detection circuit 105 configured to detect whether the switch unit 103 is turned off and provide the turn-off indication signal SHUT. In an embodiment, the turn-off detection circuit 105 may be configured to receive the first driving signal DH and the second driving signal DL, and to generate the turn-off indication signal SHUT based on the first driving signal DH and the second driving signal DL. When the first driving signal DH controls the first set of switching devices to turn off and the second driving signal DL controls the second set of switching devices to turn off, the turn-off indication signal SHUT indicates that the switch unit 103 is turned off. For this situation, the turn-off of the switch unit 103 indicated by the turn-off indication signal SHUT may include the "dead-time-off" and "system-off". In some applications, the switch unit turn-off protection circuit 100 may not need to change the freewheeling mode when the switch unit 103 is "dead-time-off". Therefore, in one embodiment, the turn-off detection circuit 105 may further be configured to receive a system enable signal EN, which may be configured to indicate whether the application circuit to which the switch unit 103 belongs is operating. The turn-off detection circuit 105 may be configured to provide the turn-off indication signal SHUT based on the system enable signal EN, the first driving signal DH, and the second driving signal DL. When the system enable signal EN indicates that the application circuit to which the switch unit 103 belongs is not in operation and the first driving signal DH and the second driving signal DL respectively control the first set of switching devices and the second set of switching devices to turn off, the turn-off indication signal SHUT indicates that the switch unit 103 is "system off".

According to an exemplary embodiment of the present disclosure, the freewheeling direction detecting circuit 101 may be coupled to the first circuit node N1 and the output node SW of the switch unit 103, and may be configured to compare a switch node potential VSW at the output node SW (take the reference ground potential GND as a reference) with a first circuit node potential VN1 at the first circuit node N1 (take the reference ground potential GND as a reference) to provide a first determination signal S1. If the switch node potential VSW is higher than the first circuit node potential VN1, it indicates that when the switch unit 103 is switched off, the freewheeling current is flowing from the inductive power storage device L to the output node SW, which means that the freewheeling current is the first freewheeling current I1 that needs freewheeling from the output node SW to the first circuit node N1 via body diode(s) of the first set of switching devices. Therefore, for this situation, the freewheeling direction detecting circuit 101 may be configured to turn on the first set of switching devices (for example, the first switching device 1031 illustrated in FIG. 1) instead of the body diode(s) of the first set of switching devices to circulate the first freewheeling current I1. In an embodiment, if the switch node potential VSW is higher than the first circuit node potential VN1, the first determination signal S1 may have a first logic state (for example, a high logic state), and the freewheeling direction detecting circuit 101 may be configured to turn on the first set of switching devices in response to the first logic state of the first determination signal S1. If the switch node potential VSW is lower than the first circuit node potential VN1, it indicates that when the switch unit 103 is switched off, the freewheeling current is flowing from the output node SW to the inductive power storage device L, which means that the freewheeling current is the second freewheeling current I2 that needs freewheeling from the second circuit node N2 to the output node SW via body diode(s) of the second set of switching devices. Therefore, for this situation, the freewheeling direction detecting circuit 101 may be configured to turn on the second set of switching devices (for example, the second switching device 1032 illustrated in FIG. 1) instead of the body diode(s) of the second set of switching devices to circulate the second freewheeling current I2. In an embodiment, if the switch node potential VSW is lower than the first circuit node potential VN1, the first determination signal S1 may have a second logic state (for example, a low logic state), and the freewheeling direction detecting circuit 101 may be configured to turn on the second set of switching devices in response to the second logic state of the first determination signal S1.

According to an embodiment of the present disclosure, the enable terminal EN1 of the freewheeling direction detecting circuit 101 may be coupled to the turn-off detection circuit 105 to receive the turn-off indication signal SHUT, and may be enabled when the turn-off indication signal SHUT indicates that the switch unit 103 is turned off (or, in some embodiments, when the turn-off indication signal SHUT indicates that the switch unit 103 is "system off"). Otherwise, the freewheeling direction detecting circuit 101 remains disabled. Those skilled in the art should understand that the turn-off indication signal SHUT may be configured to control the enable or disable of the freewheeling direction detecting circuit 101 in various implementations. For example, the freewheeling direction detecting circuit 101 may be disabled in entirety in an embodiment. In an alternative embodiment, an output signal (for example, the first determination signal S1 in the embodiment shown in FIG. 1) of the freewheeling direction detecting circuit 101 may be shielded so that the output signal has no effect on the downstream controlled circuit, etc., which will not be exhaustively addressed in this disclosure. Various modified implementations of enabling or disabling the freewheeling direction detecting circuit 101 based on the turn-off indication signal SHUT do not go beyond the spirit and protection scope of the present disclosure.

Figure 2:
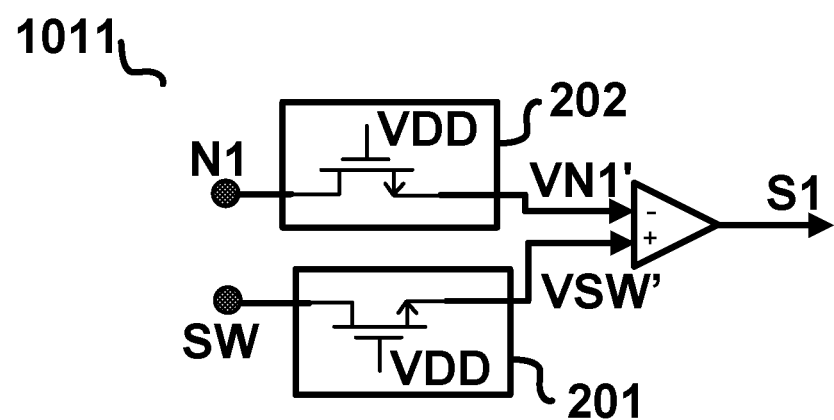
FIG. 2 illustrates a schematic diagram of a freewheeling direction detecting circuit 101 in accordance with an embodiment of the present invention.

According to an exemplary embodiment of the present disclosure, as shown in FIG. 2, the freewheeling direction detecting circuit 101 may comprise a first comparison circuit 1011. Those skilled in the art should understand that in addition to the first comparison circuit 1011, the freewheeling direction detecting circuit 101 may also include other circuits or components, which are not shown for brevity. A first input terminal of the first comparison circuit 1011 (for example, the "+" input terminal of 1011 shown in FIG. 2) may be coupled to the output node SW to receive a switch node potential indication signal VSW' that is indicative of the switch node potential VSW at the output node SW, a second input terminal (for example, the "−" input terminal of 1011 shown in FIG. 2) may be coupled to the first circuit node N1 to receive a first node potential indication signal VN1' that is indicative of the first circuit node potential VN1 at the first circuit node N1. Those skilled in the art should understand that the switch node potential indication signal VSW' may include the switch node potential VSW at the output node SW itself, or it may be a signal reduced or divided from the switch node potential VSW. For example, FIG. 2 illustrates that the switch node potential VSW at the output node SW may be processed by a first processing unit 201 to provide the switch node potential indication signal VSW'. In the example of FIG. 2, the first processing unit 201 schematically may include a high-voltage withstanding transistor, the drain terminal of which may be coupled to the output node SW, and the source terminal of which may be coupled to the first input terminal of the first comparison circuit 1011, and the gate terminal of which may be coupled to a voltage VDD higher than a turn-on threshold voltage of the high-voltage withstanding transistor. However, this is only to provide an example to help understand the technical solution of the present disclosure. Those skilled in the art should understand that the first processing unit 201 may include other circuits/elements that that can withstand the switch node potential VSW at the output node SW and provide the switch node potential indication signal VSW'. In the case that the switch node potential VSW at the output node SW does not exceed the maximum voltage that the first comparison circuit 1011 can withstand, the first processing unit 201 may be omitted and the switch node potential VSW may be directly provided as the switch node potential indication signal VSW'. In the same way, those skilled in the art should understand that the first node potential indication signal VN1' may include the first circuit node potential VN1 at the first circuit node N1 itself, or it may be a signal reduced or divided from the switch node potential VSW. For example, FIG. 2 illustrates that the first circuit node potential VN1 at the first circuit node N1 may be processed by a second processing unit 202 to provide the first node potential indication signal VN1'. In the example of FIG. 2, the second processing unit 202 is also illustrated as including a high-voltage withstanding transistor having a drain terminal, a source terminal, and a gate terminal that are respectively coupled to the first circuit node N1, the second input terminal of the first comparison circuit 1011, and the voltage VDD higher than a turn-on threshold voltage of the high-voltage withstanding transistor. However, this is just to provide an example to help understand the technical solution of the present disclosure. Those skilled in the art should understand that the second processing unit 202 may include other circuits/elements that can withstand the first circuit node potential VN1 at the first circuit node N1 and provide the first node potential indication signal VN1'. In the case that the first circuit node potential VN1 at the first circuit node N1 does not exceed the maximum voltage that the first comparison circuit 1011 can withstand, it is also possible to directly provide the first circuit node potential VN1 as the first node potential indication signal VN1' without providing the second processing unit 202. The first comparison circuit 1011 may be configured to compare the switch node potential indication signal VSW' with the first node potential indication signal VN1' to provide the first determination signal S1. When the switch node potential indication signal VSW' is higher than the first node potential indication signal VN1' (which means that the switch node potential VSW at the output node SW is higher than the first circuit node potential VN1 at the first circuit node N1), the first determination signal S1 may be set to the first logic state. When the switch node potential indication signal VSW' is lower than the first node potential indication signal VN1' (which means that the switch node potential VSW at the output node SW is lower than the first circuit node potential VN1 at the first circuit node N1), the first determination signal S1 may beset to the second logic state.

According to an exemplary embodiment of the present disclosure, the freewheeling mode regulating circuit 102 may be coupled to the switch unit 103 and the turn-off detection circuit 105. The enable terminal EN2 of the freewheeling mode regulating circuit 102 may receive the turn-off indication signal SHUT, and may be enabled when the turn-off indication signal SHUT indicates that the switch unit 103 is turned off (or further in some embodiments, the turn-off indication signal SHUT indicates that the switch unit 103 is "system-off"). Otherwise the freewheeling mode regulating circuit 102 may not be enabled. When the freewheeling mode regulating circuit 102 is enabled, it may be configured to detect the first freewheeling current I1 flowing through the first set of switching devices, and may further be configured to turn off (for example, by outputting a first turn-off signal $H_{OFF}$) the first set of switching devices when the first freewheeling current I1 is lower than (may include equal to) the first preset/predetermined safe current threshold Ith1. The freewheeling mode regulating circuit 102 may further be configured to detect the second freewheeling current I2 flowing through the second set of switching devices when enabled, and when the second freewheeling current I2 is lower than (may include equal to) the second preset/predetermined safe current threshold Ith2, the freewheeling mode regulating circuit 102 may further be configured to turn off (for example, by outputting the second turn-off signal $L_{OFF}$) the second set of switching devices. Those skilled in the art should understand that the turn-off indication signal SHUT may be configured to control the enable or disable of the freewheeling mode regulating circuit 102 in various implementations. For example, the freewheeling mode regulating circuit 102 may be disabled in entirety in an embodiment. In an alternative embodiment, output signal(s) (for instance, the first turn-off signal $H_{OFF}$ and the second turn-off signal $L_{OFF}$ in the embodiment shown in FIG. 1) of the freewheeling mode regulating circuit 102 may be shielded so that the output signal(s) has no effect on the downstream controlled circuit, etc., which will not be exhaustively addressed in this disclosure. Various modified implementations of enabling or disabling the freewheeling mode regulating circuit 102 based on the turn-off indication signal SHUT do not exceed the spirit and protection scope of the present disclosure.

Figure 3:
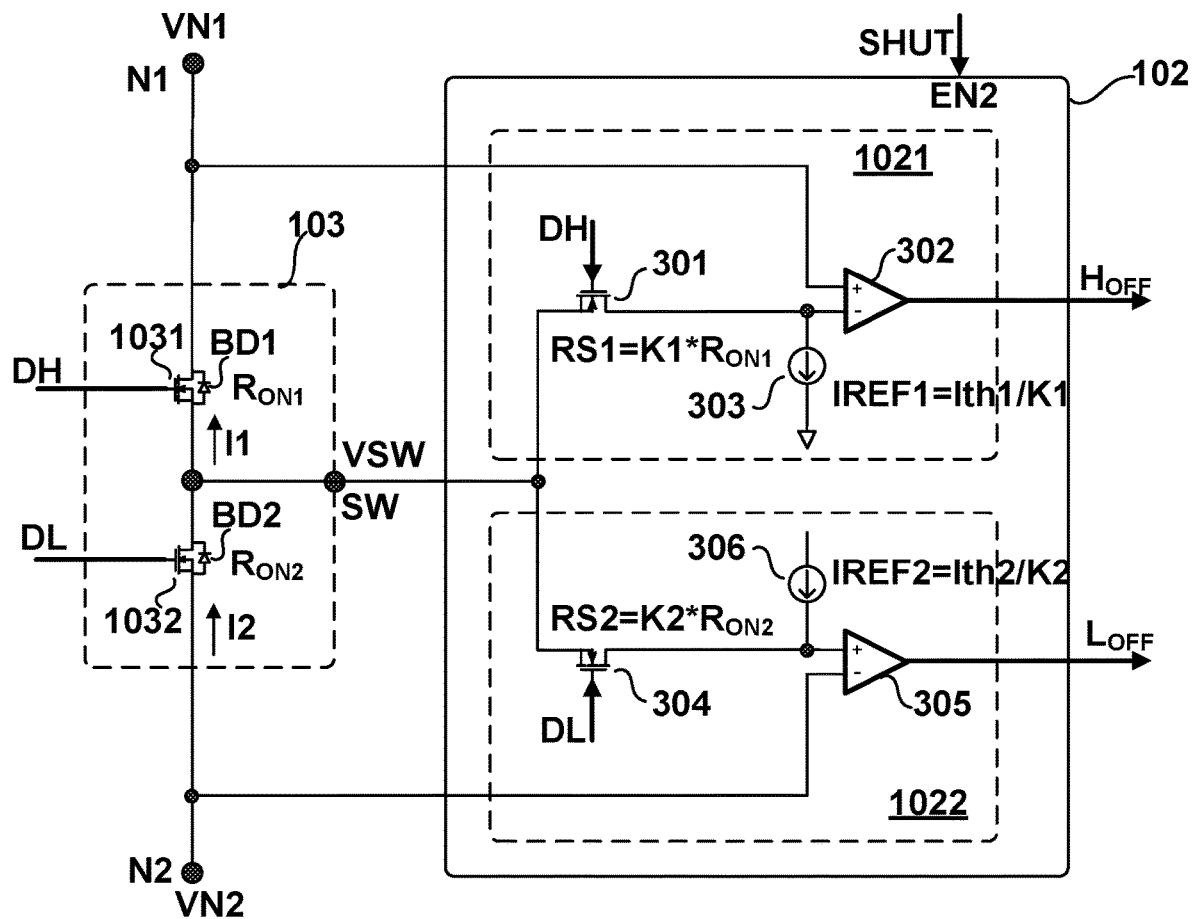
FIG. 3 illustrates a schematic diagram of a freewheeling mode regulating circuit 102 in accordance with an embodiment of the present invention.

According to an exemplary embodiment of the present disclosure, as shown in FIG. 3, the freewheeling mode regulating circuit 102 may comprise a first freewheeling regulating circuit 1021 and a second freewheeling regulating circuit 1022. Those skilled in the art would understand that in addition to the first freewheeling regulating circuit 1021 and the second freewheeling regulating circuit 1022, the freewheeling mode regulating circuit 102 may also include other circuits or components, which are not shown for brevity. The first freewheeling regulating circuit 1021 may be coupled to the first set of switching devices (for example, the first switching device 1031 illustrated in the embodiments of the present disclosure), and may be configured to detect the first freewheeling current I1 flowing through the first set of switching devices, and may be configured to compare the first freewheeling current I1 with the first preset/predetermined safe current threshold Ith1 to provide the first turn-off signal $H_{OFF}$. When the first freewheeling current I1 is lower than (may include equal to) the first preset/predetermined safe current threshold Ith1, the switch unit turn-off protection circuit 100 may be configured to turn off the first set of switching devices (for example, the first switching device 1031 illustrated in the embodiments of the present disclosure) in response to the first turn-off signal $H_{OFF}$. For instance, the first turn-off signal $H_{OFF}$ may be sent to the control circuit 104, and processed by the control circuit 104 to trigger the first driving signal DH to turn off the first set of switching devices (for example, the first switching device 1031 illustrated in the embodiments of the present disclosure) when the first freewheeling current I1 is lower than the first preset/predetermined safe current threshold Ith1. The second freewheeling regulating circuit 1022 may be coupled to the second set of switching devices (for example, the second switching device 1032 illustrated in the embodiments of the present disclosure), and may be configured to detect the second freewheeling current I2 flowing through the second set of switching devices, and may be configured to compare the second freewheeling current I2 with the second preset/predetermined safe current threshold Ith2 to provide the second turn-off signal $L_{OFF}$. When the second freewheeling current I2 is lower than (may include equal to) the second preset/predetermined safe current threshold Ith2, the switch unit turn-off protection circuit 100 may be configured to turn off the second set of switching devices (for example, the second switching device 1032 illustrated in the embodiments of the present disclosure) in response to the second turn-off signal $L_{OFF}$. For instance, the second turn-off signal $L_{OFF}$ may be sent to the control circuit 104, and processed by the control circuit 104 to trigger the second driving signal DL to turn off the second set of switching devices (for example, the second switching device 1032 illustrated in the embodiments of the present disclosure) when the second freewheeling current I2 is lower than the second preset/predetermined safe current threshold Ith2.

In the exemplary embodiment of FIG. 3, the first freewheeling regulating circuit 1021 may comprise a first detecting transistor 301, a first regulating comparator 302 and a first current source 303. A first terminal of the first detecting transistor 301 may be coupled to the output node SW, a second terminal of the first detecting transistor 301 may be coupled to a first input terminal of the first regulating comparator 302 (for example, the "−" input terminal of 302 shown in FIG. 3), and a control terminal of the first detecting transistor 301 may be coupled to the control terminal of the first set of switching devices for receiving the first driving signal DH. In an embodiment, the first detecting transistor 301 may be configured to have a first predetermined ratio K1 between an equivalent channel width-to-length ratio of the first set of switching devices (for example, a channel width-to-length ratio of the first switching device 1031 illustrated in each embodiment of the present disclosure) and a channel width-to-length ratio of the first detecting transistor 301, wherein the first predetermined ratio K1 is positive. In consequence, an on-resistance RS1 of the first detecting transistor 301 and an equivalent on-resistance value $R_{ON1}$ of the first set of switching devices (for example, an equivalent on-resistance value $R_{ON1}$ of the first switching device 1031 illustrated in the embodiments of the present disclosure) also has the first predetermined ratio K1, that is, RS1=K1*$R_{ON1}$. The first input terminal of the first regulating comparator 302 (for example, the "−" input terminal of 302 shown in FIG. 3) may further be coupled to the first current source 303, a second input terminal (for example, the "+" input terminal of 302 as shown in FIG. 3) of the first regulating comparator 302 may be coupled to the first circuit node N1, and an output terminal of the first regulating comparator 302 may be configured to provide the first turn-off signal $H_{OFF}$. The first current source 303 may be coupled between the first input terminal of the first regulating comparator 302 (for example, the "−" input terminal of 302 shown in FIG. 3) and the reference ground GND, and may be configured to adjust a first reference current IREF1 flowing out from the first input terminal of the first regulating comparator 302 (for example, flowing to the reference ground). The first reference current IREF1 may be used to adjust/set the value of the first preset/predetermined safe current threshold Ith1. In fact, the first preset/predetermined safe current threshold Ith1 and the first reference current IREF1 may also have the first predetermined ratio K1, that is: Ith1=K1*IREF1. Therefore, by adjusting the magnitude of the first reference current IREF1, the magnitude of the first preset/predetermined safe current threshold Ith1 can be adjusted. In the example of FIG. 3, when the first freewheeling current I1 is smaller than the first preset/predetermined safe current threshold Ith1, the first turn-off signal $H_{OFF}$ has a turn-off signal first logic state (for example, a high logic state). When the first freewheeling current I1 is greater than the first preset/predetermined safe current threshold Ith1, the first turn-off signal $H_{OFF}$ has a turn-off signal second logic state (for example, a low logic state) opposite to the turn-off signal first logic state. The control circuit 104 may be configured to turn off the first set of switching devices (for example, the first switching device 1031 illustrated in the embodiments of the present disclosure) in response to the turn-off signal first logic state of the first turn-off signal $H_{OFF}$. Similarly, the second freewheeling adjusting circuit 1022 may comprise a second detecting transistor 304, a second regulating comparator 305, and a second current source 306. A first terminal of the second detecting transistor 304 may be coupled to the output node SW, a second terminal of the second detecting transistor 304 may be coupled to a first input terminal of the second regulating comparator 305 (for example, the "+" input terminal of 305 shown in FIG. 3), and a control terminal of the second detecting transistor 304 may be coupled to the control terminal of the second set of switching devices for receiving the second driving signal DL. In an embodiment, the second detecting transistor 304 may be configured to have a second predetermined ratio K2 between an equivalent channel width-to-length ratio of the second set of switching devices (for example, a channel width-to-length ratio of the second switching device 1032 illustrated in each embodiment of the present disclosure) and a channel width-to-length ratio of the second detecting transistor 304, wherein the second predetermined ratio K2 is positive. In consequence, an on-resistance RS2 of the second detecting transistor 304 and an equivalent on-resistance value $R_{ON2}$ of the second set of switching devices (for example, an equivalent on-resistance value $R_{ON2}$ of the second switching device 1032 illustrated in the embodiments of the present disclosure) also has the second predetermined ratio K2, that is, RS2=K2*$R_{ON2}$. The first input terminal of the second regulating comparator 305 (for example, the "+" input terminal of 305 shown in FIG. 3) may further be coupled to the second current source 306, a second input terminal (for example, the "−" input terminal of 305 as shown in FIG. 3) of the second regulating comparator 305 may be coupled to the second circuit node N2, and an output terminal of the second regulating comparator 305 may be configured to provide the second turn-off signal $L_{OFF}$. The second current source 306 may be coupled to the first input terminal of the second regulating comparator 305 (for example, the "+" input terminal of 305 shown in FIG. 3), and may be configured to adjust a second reference current IREF2 flowing into the first input terminal of the second regulating comparator 305. The second reference current IREF2 may be used to adjust/set the value of the second preset/predetermined safe current threshold Ith2. In fact, the second preset/predetermined safe current threshold Ith1 and the first reference current IREF1 may also have the second predetermined ratio K2, that is: Ith2=K2*IREF2. Therefore, by adjusting the magnitude of the second reference current IREF2, the magnitude of the second preset/predetermined safe current threshold Ith2 can be adjusted. In the example of FIG. 3, when the second freewheeling current I2 is smaller than the second preset/predetermined safe current threshold Ith2, the second turn-off signal $L_{OFF}$ has a turn-off signal third logic state (for example, a high logic state). When the second freewheeling current I2 is greater than the second preset/predetermined safe current threshold Ith2, the second turn-off signal $L_{OFF}$ has a turn-off signal fourth logic state (for example, a low logic state) opposite to the turn-off signal third logic state. The control circuit 104 may be configured to turn off the second set of switching devices (for example, the second switching device 1032 illustrated in the embodiments of the present disclosure) in response to the turn-off signal third logic state of the second turn-off signal $L_{OFF}$.

Figure 4:
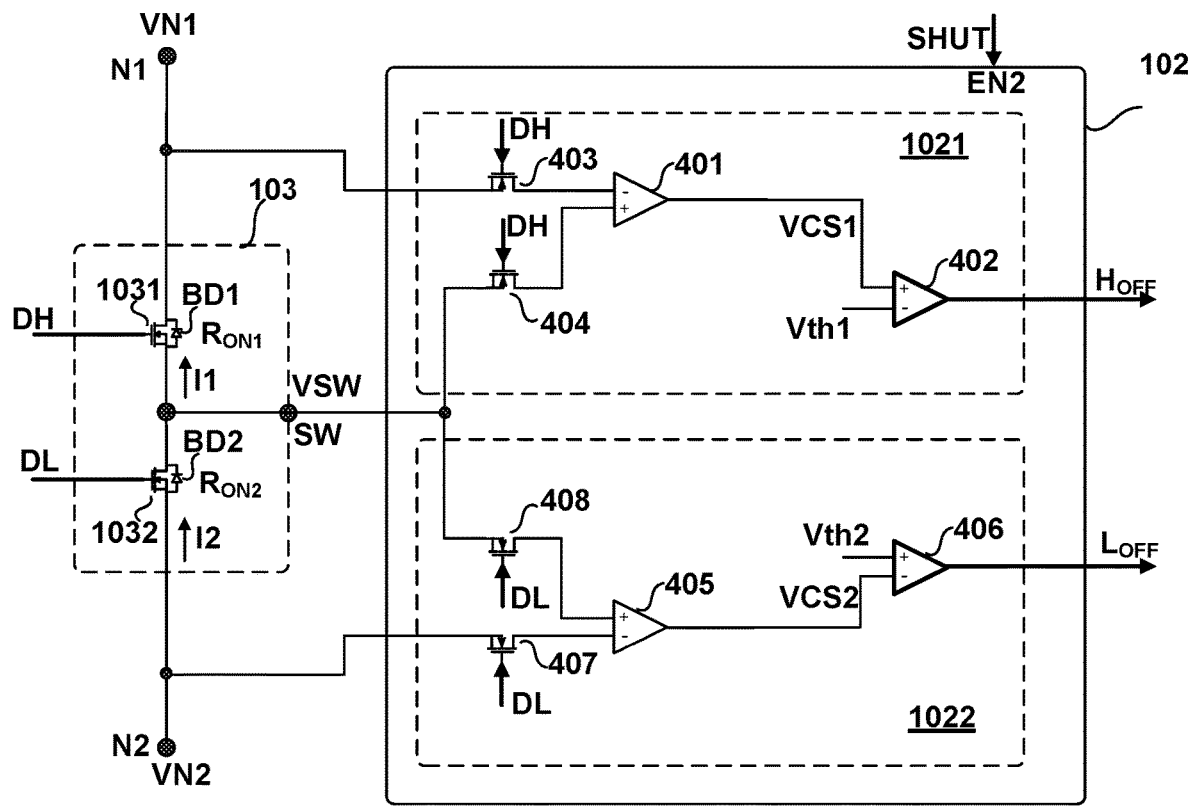
FIG. 4 illustrates a schematic diagram of a freewheeling mode regulating circuit 102 in accordance with an alternative embodiment of the present invention.

Those skilled in the art should understand that the freewheeling mode regulating circuit 102 may have various implementation schemes, which are not limited to the exemplary embodiment described above in conjunction with FIG. 3 of the present disclosure. According to an alternative exemplary embodiment of the present disclosure, as shown in FIG. 4, the freewheeling mode regulating circuit 102 may still comprise a first freewheeling regulating circuit 1021 and a second freewheeling regulating circuit 1022. Different from the example shown in FIG. 3, the first freewheeling regulating circuit 1021 in the example of FIG. 4 may include a first current detection amplifier 401 and a third regulating comparator 402, and the second freewheeling regulating circuit 1022 may include a second current detection amplifier 405 and a fourth regulating comparator 406. A first input terminal (for example, the "−" input terminal of 401 shown in FIG. 4) of the first current detection amplifier 401 may be coupled to the first circuit node N1, and a second input terminal (for example, the "+" input terminal of 401 shown in FIG. 4) of the first current detection amplifier 401 may be coupled to the output node SW, and the first current detection amplifier 401 may be configured to detect the first freewheeling current I1 flowing through the first set of switching devices (for example, the first switching device 1031 illustrated in the embodiments of the present disclosure) and provide a first current detection signal VCS1 indicative of the first freewheeling current I1 at an output terminal of the first current detection amplifier 401. A first input terminal of the third regulating comparator 402 (for example, the "+" input terminal of 402 shown in FIG. 4) may be coupled to the output terminal of the first current detection amplifier 401 to receive the first current detection signal VCS1, a second input terminal (for example, the "−" input terminal of 402 shown in FIG. 4) of the first current detection amplifier 401 may be configured to receive a first threshold signal Vth1 indicative of the first preset/predetermined safe current threshold Ith1, and the third regulating comparator 402 may be configured to realize the comparison between the first freewheeling current I1 and the first preset/predetermined safe current threshold Ith1 based on comparing the first current detection signal VCS1 with the first threshold signal Vth1, and provide the first turn off signal $H_{OFF}$ at its output terminal. Optionally, the first input terminal of the first current detection amplifier 401 (for example, the "−" input terminal of 401 shown in FIG. 4) may be coupled to the first circuit node N1 through a third detecting transistor 403, a control terminal of the third detecting transistor 403 may be coupled to the control terminal of the first set of switching devices for receiving the first driving signal DH; the second input terminal of the first current detection amplifier 401 (for example, the "+" input terminal of 401 as shown in FIG. 4) may be coupled to the output node SW through a fourth detecting transistor 404, and a control terminal of the fourth detecting transistor 404 may be coupled to the control terminal of the first set of switching devices for receiving the first driving signal DH. A first input terminal (for example, the "−" input terminal of 405 shown in FIG. 4) of the second current detection amplifier 405 may be coupled to the second circuit node N2, and a second input terminal (for example, the "+" input terminal of 405 shown in FIG. 4) of the second current detection amplifier 405 may be coupled to the output node SW, and the second current detection amplifier 405 may be configured to detect the second freewheeling current I2 flowing through the second set of switching devices (for example, the second switching device 1032 illustrated in the embodiments of the present disclosure) and provide a second current detection signal VCS2 indicative of the second freewheeling current I2 at an output terminal of the second current detection amplifier 405. A first input terminal of the fourth regulating comparator 406 (for example, the "+" input terminal of 406 shown in FIG. 4) may be coupled to the output terminal of the second current detection amplifier 405 to receive the second current detection signal VCS2, a second input terminal (for example, the "−" input terminal of 406 shown in FIG. 4) of the fourth regulating comparator 406 may be configured to receive a second threshold signal Vth2 indicative of the second preset/predetermined safe current threshold Ith2, and the fourth regulating comparator 406 may be configured to realize the comparison between the second freewheeling current I2 and the second preset/predetermined safe current threshold Ith2 based on comparing the second current detection signal VCS2 with the second threshold signal Vth2, and provide the second turn off signal $L_{OFF}$ at its output terminal. Optionally, the first input terminal of the second current detection amplifier 405 (for example, the "−" input terminal of 405 shown in FIG. 4) may be coupled to the second circuit node N2 through a fifth detecting transistor 407, a control terminal of the fifth detecting transistor 407 may be coupled to the control terminal of the second set of switching devices for receiving the second driving signal DH; the second input terminal of the second current detection amplifier 405 (for example, the "+" input terminal of 405 as shown in FIG. 4) may be coupled to the output node SW through a sixth detecting transistor 408, and a control terminal of the sixth detecting transistor 408 may be coupled to the control terminal of the second set of switching devices for receiving the second driving signal DL.

Figure 5:
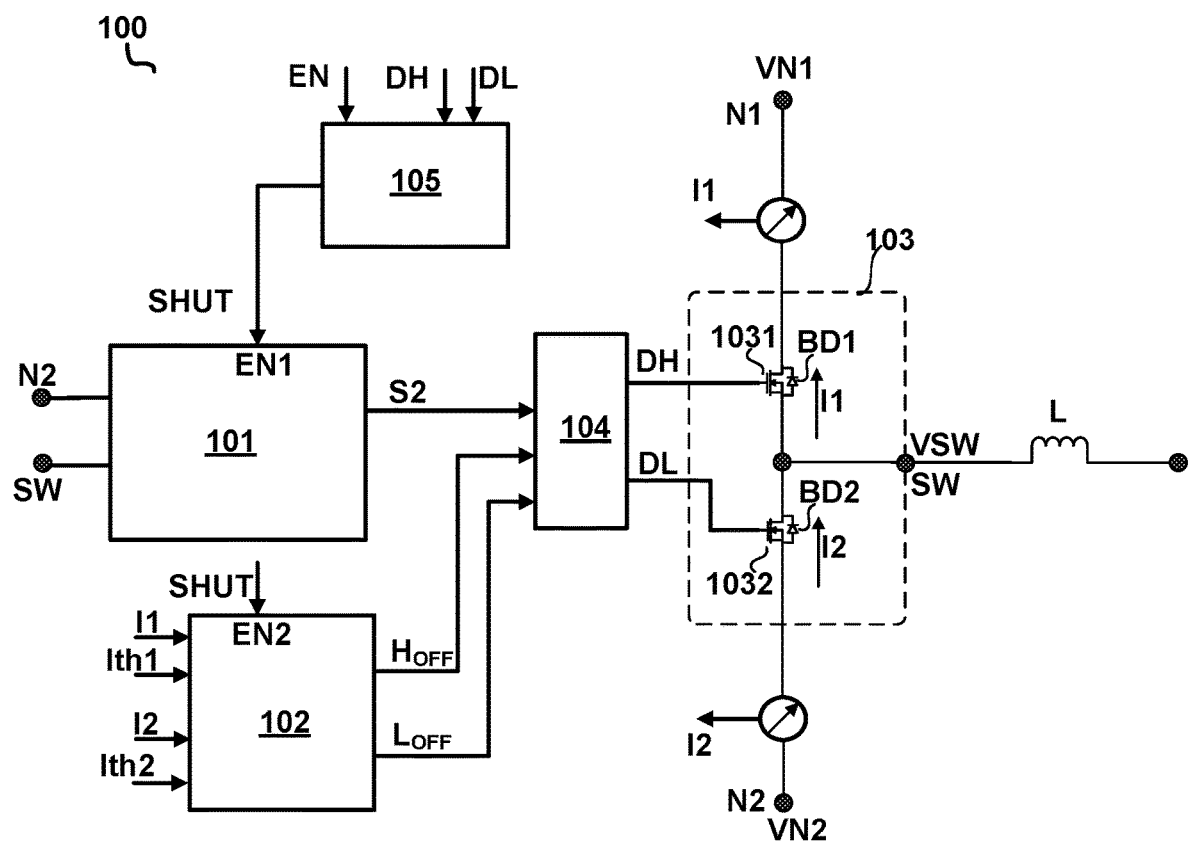
FIG. 5 illustrates a block diagram of a switch unit turn-off protection circuit 100 in accordance with an alternative embodiment of the present invention.

According to an exemplary embodiment of the present disclosure, as shown in FIG. 5, the freewheeling direction detecting circuit 101 may be coupled to the second circuit node N2 and the output node SW of the switch unit 103. When the freewheeling direction detecting circuit 101 is enabled, it may be configured to compare the switch node potential VSW at the output node SW (referenced to the reference ground potential GND) with the second circuit node potential VN2 (referenced to the reference ground potential GND) at the second circuit node N2 to provide a second determination signal S2. If the switch node potential VSW at the output node SW is higher than the second circuit node potential VN2, it indicates that when the switch unit 103 is switched off, the freewheeling current is flowing from the inductive power storage device L to the output node SW, which means that the freewheeling current is the first freewheeling current I1 that needs freewheeling from the output node SW to the first circuit node N1 via body diode(s) of the first set of switching devices. Therefore, for this situation, the freewheeling direction detecting circuit 101 may be configured to turn on the first set of switching devices (for example, the first switching device 1031 illustrated in FIG. 1) instead of the body diode(s) of the first set of switching devices to circulate the first freewheeling current I1. In an embodiment, if the switch node potential VSW is higher than the second circuit node potential VN2, the second determination signal S2 may have a first logic state (for example, a high logic state), and the freewheeling direction detecting circuit 101 may be configured to turn on the first set of switching devices in response to the first logic state of the second determination signal S2. If the switch node potential VSW is lower than the second circuit node potential VN2, it indicates that when the switch unit 103 is switched off, the freewheeling current is flowing from the output node SW to the inductive power storage device L, which means that the freewheeling current is the second freewheeling current I2 that needs freewheeling from the second circuit node N2 to the output node SW via body diode(s) of the second set of switching devices. Therefore, for this situation, the freewheeling direction detecting circuit 101 may be configured to turn on the second set of switching devices (for example, the second switching device 1032 illustrated in FIG. 1) instead of the body diode(s) of the second set of switching devices to circulate the second freewheeling current I2. In an embodiment, if the switch node potential VSW is lower than the second circuit node potential VN2, the second determination signal S2 may have a second logic state (for example, a low logic state), and the freewheeling direction detecting circuit 101 may be configured to turn on the second set of switching devices in response to the second logic state of the second determination signal S2.

Figure 6:
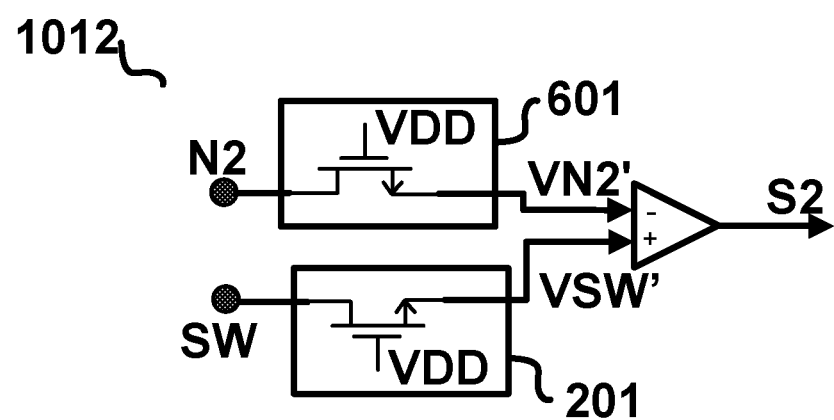
FIG. 6 illustrates a schematic diagram of a freewheeling direction detecting circuit 101 in accordance with an alternative embodiment of the present invention.

According to an exemplary embodiment of the present disclosure, as shown in FIG. 6, the freewheeling direction detecting circuit 101 may comprise a second comparison circuit 1012. Those skilled in the art should understand that in addition to the second comparison circuit 1012, the freewheeling direction detecting circuit 101 may also include other circuits or components, which are not shown for brevity. A first input terminal of the second comparison circuit 1012 (for example, the "+" input terminal of 1012 shown in FIG. 6) may be coupled to the output node SW to receive a switch node potential indication signal VSW' that is indicative of the switch node potential VSW at the output node SW, a second input terminal (for example, the "−" input terminal of 1012 shown in FIG. 6) may be coupled to the second circuit node N2 to receive a second node potential indication signal VN2' that is indicative of the second circuit node potential VN2 at the first circuit node N2. Those skilled in the art should understand that the switch node potential indication signal VSW' may include the switch node potential VSW at the output node SW itself, or it may be a signal reduced or divided from the switch node potential VSW at the output node SW, for example, through the first processing unit 201 as shown in FIG. 6. The configuration and operation principles of the first processing unit 201 in FIG. bare the same as or similar to those of the first processing unit 201 shown in FIG. 2, and will not be repeated here. Those skilled in the art should understand that the second node potential indication signal VN2' may include the second circuit node potential VN2 at the second circuit node N2 itself, or it may be a signal reduced or divided from the second circuit node potential VN2 at the second circuit node N2. For example, FIG. 6 illustrates that the second circuit node potential VN2 at the second circuit node N2 may be processed by the third processing unit 601 to provide the second node potential indication signal VN2'. In the example of FIG. 6, the third processing unit 601 is also illustrated as including a high-voltage withstanding transistor having a drain terminal, a source terminal, and a gate terminal that are respectively coupled to the second circuit node N1, the second input terminal of the second comparison circuit 1012, and the voltage VDD higher than a turn-on threshold voltage of the high-voltage withstanding transistor. However, this is only to provide an example to help understand the technical solution of the present disclosure. Those skilled in the art should understand that the third processing unit 601 may include other circuits/elements that can withstand the second circuit node potential VN2 and provide the second node potential indication signal VN1'. In the case where the second circuit node potential VN2 at the second circuit node N2 does not exceed the maximum voltage that the second comparison circuit 1012 can withstand, it is also possible to directly provide the second circuit node potential VN2 as the second node potential indication signal VN1' without providing the third processing unit 601. The second circuit node potential VN2 of is used as the second node potential indication signal VN2'. The second comparison circuit 1012 may be configured to compare the switch node potential indication signal VSW' with the second node potential indication signal VN2' to provide the second determination signal S2. When the switch node potential indication signal VSW' is higher than the second node potential indication signal VN2' (which means that the switch node potential VSW at the output node SW is higher than the second circuit node potential VN2 at the second circuit node N2), the second determination signal S2 may be set to the first logic state. When the switch node potential indication signal VSW' is lower than the second node potential indication signal VN2' (which means that the switch node potential VSW at the output node SW is lower than the second circuit node potential VN2 at the second circuit node N2), the second determination signal S2 may be set to the second logic state.

Figure 7:
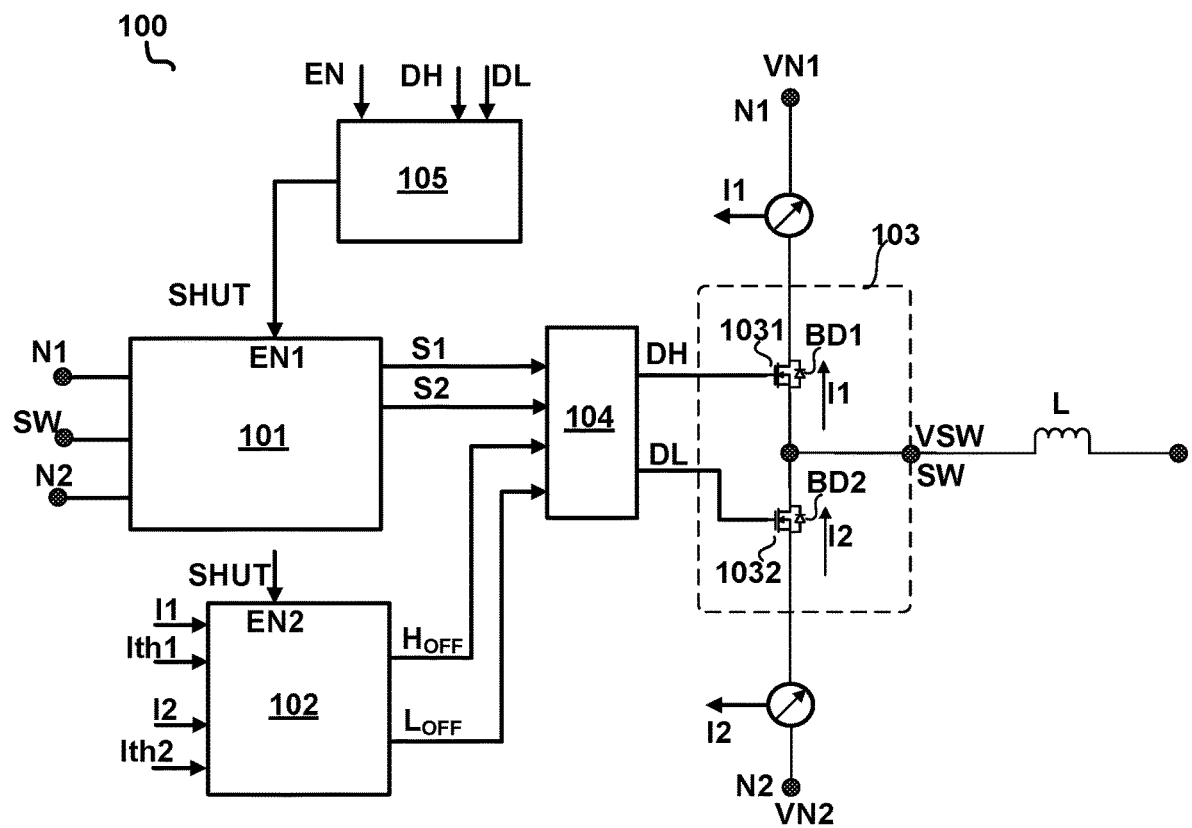
FIG. 7 illustrates a block diagram of a switch unit turn-off protection circuit 100 in accordance with an alternative embodiment of the present invention.

According to an exemplary embodiment of the present disclosure, as shown in FIG. 7, the freewheeling direction detecting circuit 101 may be coupled to the first circuit node N1, the second circuit node N2, and the output node SW of the switch unit 103. When enabled, the freewheeling direction detecting circuit 101 may be configured to compare the switch node potential VSW at the output node SW respectively with the first circuit node potential VN1 and the second circuit node potential VN2 to respectively provide the first determination signal S1 and the second determination signal S2. If the switch node potential VSW at the output node SW is higher than the first circuit node potential VN1 at the first circuit node N1, it indicates that when the switch unit 103 is switched off, the freewheeling current is flowing from the inductive power storage device L to the output node SW, which means that the freewheeling current is the first freewheeling current I1 that needs freewheeling from the output node SW to the first circuit node N1 via body diode(s) of the first set of switching devices. Therefore, for this situation, the freewheeling direction detecting circuit 101 may be configured to turn on the first set of switching devices (for example, the first switching device 1031 illustrated in FIG. 1) instead of the body diode(s) of the first set of switching devices to circulate the first freewheeling current I1. If the switch node potential VSW at the output node SW is lower than the second circuit node potential VN2 at the second circuit node N2, it indicates that when the switch unit 103 is switched off, the freewheeling current is flowing from the output node SW to the inductive power storage device L, which means that the freewheeling current is the second freewheeling current I2 that needs freewheeling from the second circuit node N2 to the output node SW via body diode(s) of the second set of switching devices. Therefore, for this situation, the freewheeling direction detecting circuit 101 may be configured to turn on the second set of switching devices (for example, the second switching device 1032 illustrated in FIG. 1) instead of the body diode(s) of the second set of switching devices to circulate the second freewheeling current I2. If the switch node potential VSW of the output node SW is higher than the second circuit node potential VN2 and lower than the first circuit node potential VN1, it indicates that when the switch unit 103 is switched off, there is no current needing freewheeling via either the body diodes of the first set of switching devices or the body diodes of the second set of switching devices, so no further control is performed on the switch unit 103, which is rarely or almost never occurs in practical applications. In terms of theoretical design, the implementation of the freewheeling direction detecting circuit 101 shown in FIG. 7 may be safer than the implementations shown in FIG. 1, FIG. 2, FIG. 5, and FIG. 6. In one embodiment, if the switch node potential VSW at the output node SW is higher than the first circuit node potential VN1 at the first circuit node N1, the first determination signal S1 has a first logic state (for example, a high logic state), the freewheeling direction detecting circuit 101 may be configured to turn on the first set of switching devices based on the first logic state of the first determination signal S1; if the switch node potential VSW at the output node SW is lower than the second circuit node N2 at the second circuit node potential VN2, the second determination signal S2 has a second logic state (for example, a low logic state) opposite to the first logic state, and the freewheeling direction detecting circuit 101 may be configured to turn on the second set of switching devices based on the second logic state of the second determination signal S2. In another embodiment, if the switch node potential VSW at the output node SW is higher than the first circuit node potential VN1, the first determination signal S1 has a first logic state (for example, a high logic State), the freewheeling direction detecting circuit 101 may be configured to turn on the first set of switching devices based on the first logic state of the first determination signal S1; if the switch node potential VSW at the output node SW is lower than the second circuit node potential VN2, the second determination signal S2 has the first logic state (for example, a high logic state), and the freewheeling direction detecting circuit 101 may be configured to turn on the second set of switching devices based on the first logic state of the second determination signal S2. Those skilled in the art should understand that when the switch node potential VSW at the output node SW is higher than the first circuit node potential VN1 at the first circuit node N1, the first determination signal has which logic state (for example, high logic state or low logic state) can be flexibly designed according to practical applications. The present disclosure only gives examples and is not intend to be limiting. For instance, changing the design settings of the logic state of the first determination signal S1 may easily be realized by performing simple logic operations (such as inverting operations, etc.) on the comparison results or by switching the signals received at the inverting input terminal and the non-inverting input terminal of the associated comparators. Similarly, when the switch node potential VSW at the output node SW is lower than the second circuit node potential VN2 at the second circuit node N2, the second determination signal S2 has which logic state (for example, high logic state or low logic state) can also be flexibly designed according to practical applications. The present disclosure only gives examples and does not intend to be limiting. For example, changing the design settings of the logic state of the first determination signal S1 may easily be realized by performing simple logic operations (such as inverting operations, etc.) on the comparison results, or by switching the signals received at the inverting input terminal and the non-inverting input terminal of the associated comparators.

Figure 8:
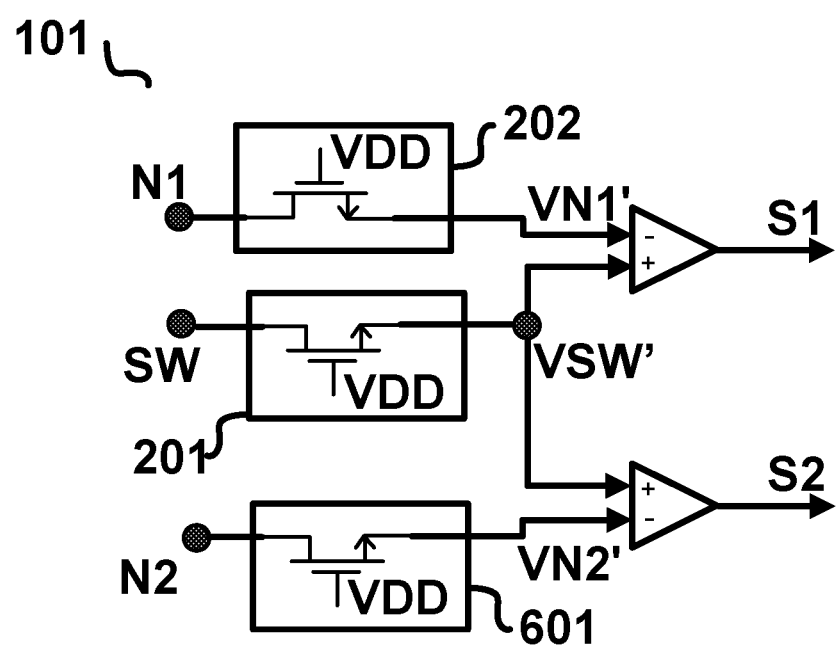
FIG. 8 illustrates a schematic diagram of a freewheeling direction detecting circuit 101 in accordance with an alternative embodiment of the present invention.
Figure 9:
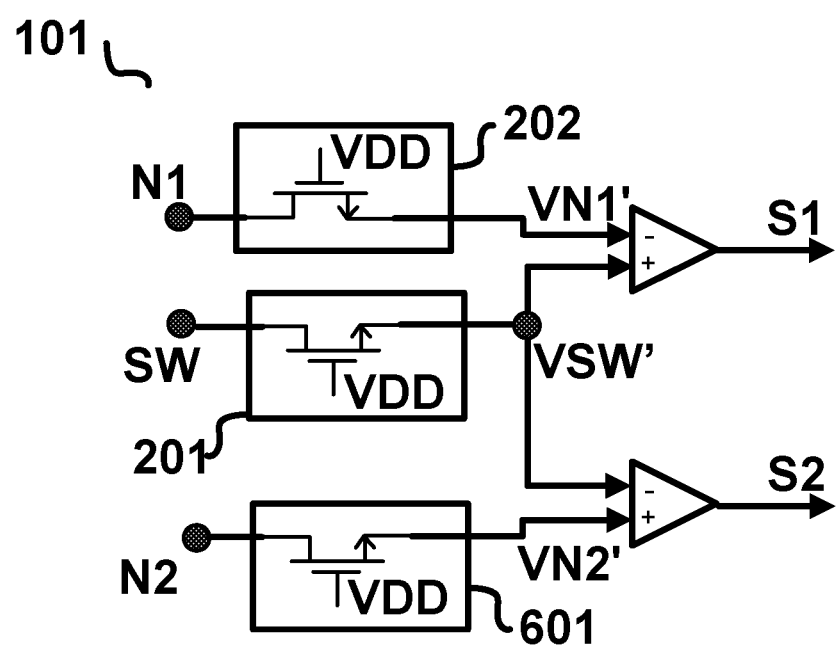
FIG. 9 illustrates a schematic diagram of a freewheeling direction detecting circuit 101 in accordance with still an alternative embodiment of the present invention.

According to an exemplary embodiment of the present disclosure, as shown in FIG. 8, the freewheeling direction detecting circuit 101 may comprise the first comparison circuit 1011 and the second comparison circuit 1012. In the present disclosure, the first comparison circuit 1011 and the second comparison circuit 1012 have been described above with reference to FIG. 2 and FIG. 6 respectively, and will not be addressed again here. In the embodiment of FIG. 8, if the switch node potential VSW at the output node SW is higher than the first circuit node potential VN1 at the first circuit node N1, the first determination signal S1 has a first logic state (for example, a high logic state), the freewheeling direction detecting circuit 101 may be configured to turn on the first set of switching devices based on the first logic state of the first determination signal S1; if the switch node potential VSW at the output node SW is lower than the second circuit node potential VN2 at the second circuit node N2, the second determination signal S2 has the first logic state (for example, a high logic state), and the freewheeling direction detecting circuit 101 may be configured to turn on the second set of switching devices based on the first logic state of the second determination signal S2. FIG. 9 shows an alternative embodiment of the freewheeling direction detecting circuit 101. The difference from FIG. 8 is that the signals received by the first input terminal and the second input terminal of the second comparison circuit 1012 are exchanged, that is, the first input terminal (for example, the "+" input terminal shown in FIG. 9) of the second comparison circuit 1012 may be coupled to the second circuit node N2 to receive the second node potential indication signal VN2' indicative of the second circuit node potential VN2 at the second circuit node N2, the second input terminal (for example, the "−" input terminal shown in FIG. 9) of the second comparison circuit 1012 may be coupled to the output node SW to receive the switch node potential indication signal VSW' that is indicative of the switch node potential VSW at the output node SW, so that the second determination signal S2 output by the second comparison circuit 1012 has the first logic state (for example, a high logic state) when the switch node potential VSW is lower than the second circuit node potential VN2. In the embodiment of FIG. 9, if the switch node potential VSW at the output node SW is higher than the first circuit node potential VN1 at the first circuit node N1, the first determination signal S1 has the first logic state (for example, a high logic state), the freewheeling direction detecting circuit 101 may be configured to turn on the first set of switching devices based on the first logic state of the first determination signal S1; if the switch node potential VSW at the output node SW is lower than the second circuit node potential VN2, the second determination signal S2 has the first logic state (for example, a high logic state), and the freewheeling direction detecting circuit 101 may be configured to turn on the second set of switching devices based on the first logic state of the second determination signal S2.

According to an exemplary embodiment of the present disclosure, the switch unit turn-off protection circuit 100 may further comprise a protection window generation circuit 106. The protection window generation circuit 106 may be configured to generate a single pulse signal PLS in response to a transition edge of the system enable signal EN at which the system enable signal EN changes to indicate that the switch unit 103 is "system off" (i.e. the application circuit to which the switch unit 103 belongs stops working), wherein the single pulse signal PLS may have a predetermined pulse width $T_{PLS}$. The protection window generation circuit 106 may further be configured to enable/activate the switch unit turn-off protection circuit 100 during the duration of the pulse width $T_{PLS}$ of the single pulse signal PLS, and to disable/deactivate the switch unit turn-off protection circuit 100 outside the duration of the pulse width $T_{PLS}$ of the single pulse signal PLS. When the switch unit turn-off protection circuit 100 is enabled/activated, it may refer to that the sub-circuits (such as the freewheeling direction detecting circuit 101 and the freewheeling mode regulating circuit 102) are enabled and function. Otherwise, when the switch unit turn-off protection circuit 100 is disabled/deactivated, it may refer to that the sub-circuits (such as the freewheeling direction detecting circuit 101 and the freewheeling mode regulating circuit 102) are disabled. It can be considered that the single pulse signal PLS sets an effective operation period (or effective operation window) $T_{PLS}$ for the switch unit turn-off protection circuit 100 commenced at the transition edge when the system enable signal EN transitions to indicate that the application circuit comprising the switch unit 103 stops working. Only during the duration of the pulse width $T_{PLS}$ of the single pulse signal PLS, if the turn-off detection circuit 105 detects that the switch unit 103 is turned off, the turn-off indication signal SHUT is configured to enable the freewheeling direction detecting circuit 101 and the freewheeling mode regulating circuit 102. If it is outside the pulse width $T_{PLS}$ of the single pulse signal PLS, regardless of whether the turn-off detection circuit 105 detects that the switch unit 103 is turned off (that is, outside the set pulse width $T_{PLS}$, even if the switch unit 103 is detected to be turned off), the freewheeling direction detecting circuit 101 and the freewheeling mode regulating circuit 102 remain disabled. In this way, the application circuit comprising the switch unit 103 may be safer and more energy-saving when "system off". Only when the switch unit 103 is detected to be turned off within the predetermined effective operation window $T_{PLS}$, the freewheeling direction detecting circuit 101 and the freewheeling mode regulating circuit 102 are enabled and effective to alleviate/avoid problems that may be caused by a relatively large freewheeling current, wherein when the freewheeling current drops to a safe current threshold (for example, when the first freewheeling current I1 drops lower than the preset/predetermined first safe current threshold Ith1 and/or the second freewheeling current I2 drops lower than the preset/predetermined second safe current threshold Ith2), the freewheeling direction detecting circuit 101 and the freewheeling mode regulating circuit 102 do not need to be enabled again/repeatedly or continuously enabled.

Figure 10:
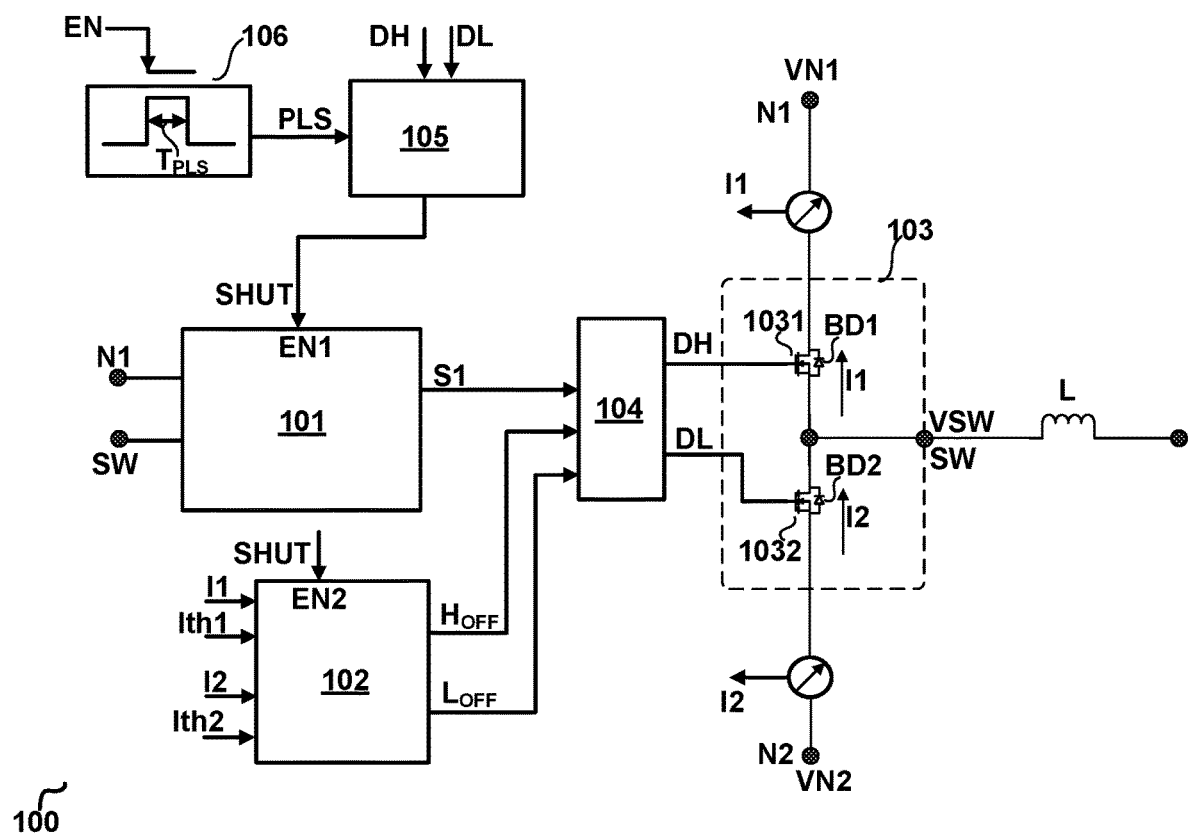
FIG. 10 illustrates a block diagram of a switch unit turn-off protection circuit 100 in accordance with an alternative embodiment of the present invention.

One of ordinary skill in the art would understand that multiple variations in the implementation circuits or implementation manners for controlling the switch unit turn-off protection circuit 100 enabled and disabled based on the protection window generation circuit 106 may be available and do not go beyond the spirit and scope of the present disclosure. FIG. 10 shows an exemplary schematic diagram of the switch unit turn-off protection circuit 100 comprising the protection window generation circuit 106 according to an exemplary embodiment of the present disclosure based on the embodiment shown in FIG. 1. In the example of FIG. 10, the protection window generation circuit 106 may be coupled to the turn-off detection circuit 105 for enabling the turn-off indication signal SHUT within the duration of the pulse width $T_{PLS}$ of the single pulse signal PLS and disabling the turn-off indication signal SHUT outside the pulse width $T_{PLS}$ of the single pulse signal PLS. The turn-off indication signal SHUT enabled may refer to that the turn-off indication signal SHUT is effective and may be able to enable the freewheeling direction detecting circuit 101 and the freewheeling mode regulating circuit 102 when it is detected that the switch unit 103 is turned off. The turn-off indication signal SHUT disabled may refer to that even if it is detected that the switch unit 103 is turned off, the turn-off indication signal SHUT is ineffective and may not be able to enable the freewheeling direction detecting circuit 101 and the freewheeling mode regulating circuit 102. The protection window generation circuit 106 may be configured in multiple ways to make the turn-off indication signal SHUT enabled and disabled, for example, a logical operation can be performed to the single pulse signal PLS and the turn-off indication signal SHUT in an embodiment, or in an alternative embodiment, a logical operation can be performed to the single pulse signal PLS with the first driving signal DH and the second driving signal DL. Those skilled in the art should understand that the protection window generation circuit 106 can also be applied to other embodiments of the present disclosure, such as the embodiments shown in FIG. 5 and FIG. 7, where the coupling relationship or controlling relationship between the protection window generation circuit 106 and the turn-off detection circuit 105, the freewheeling current direction detecting circuit 101 and the freewheeling mode regulating circuit 102 is similar to that illustrated in FIG. 10, and the will not be illustrated and addressed again here in this disclosure.

Figure 11:
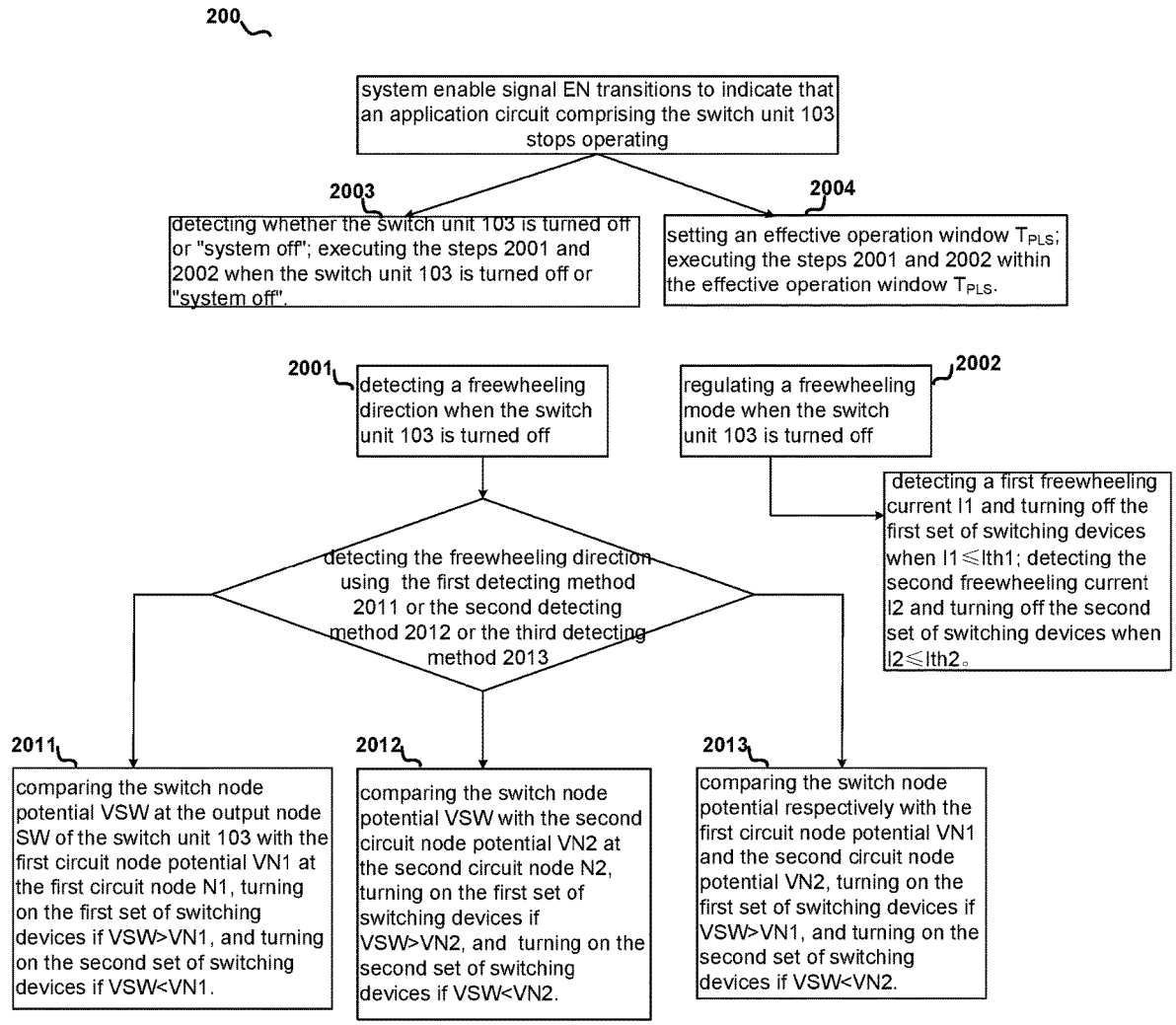
FIG. 11 illustrates an operation flow chart of a turn-off protection method 200 for a switch unit 103 in accordance with an alternative embodiment of the present invention.

FIG. 11 illustrates an operation flow chart of a turn-off protection method 200 for a switch unit 103 in accordance with an alternative embodiment of the present invention. The switch-off protection method 200 of the switch unit 103 may comprise: step 2001, detecting a freewheeling direction when the switch unit 103 is turned off; and step 2002, regulating a freewheeling mode when the switch unit 103 is turned off. In an embodiment, in step 2001, detecting the freewheeling direction may use a first detecting method 2011 comprising: comparing the switch node potential VSW at the output node SW of the switch unit 103 with the first circuit node potential VN1 at the first circuit node N1; when the switch node potential VSW is higher than the first circuit node potential VN1, turning on the first set of switching devices coupled between the first circuit node N1 and the output node SW in the switch unit 103; when the switch node potential VSW is lower than the first circuit node potential VN1, turning on the second set of switching devices coupled between the output node SW and the second circuit node N2 in the switch unit 103. In an embodiment, in step 2001, detecting the freewheeling direction may use a second detecting method 2012 comprising: comparing the switch node potential VSW with the second circuit node potential VN2 at the second circuit node N2; when the switch node potential VSW is higher than the second circuit node potential VN2, turning on the first set of switching devices; and when the switch node potential VSW is lower than the second circuit node potential VN2, turning on the second set of switching devices. In a variant embodiment, in step 2001, detecting the freewheeling direction may use a third detecting method 2013 comprising: comparing the switch node potential respectively with the first circuit node potential VN1 and the second circuit node potential VN2; when the switch node potential VSW at the output node SW is higher than the first circuit node potential VN1 at the first circuit node N1, turning on the first set of switching devices; and when the switch node potential VSW is lower than the second circuit node potential VN2, turning on the second set of switching devices.

According to an embodiment of the present disclosure, in step 2002, regulating the freewheeling mode may comprise: detecting a first freewheeling current I1 flowing through the first set of switching devices, and when the first freewheeling current I1 is smaller than a first preset/predetermined safe current threshold Ith1, turning off the first set of switching devices; and detecting the second freewheeling current I2 flowing through the second set of switching devices, and when the second freewheeling current I2 is smaller than the second preset/predetermined safe current threshold Ith2, turning off the second set of switching devices.

According to an embodiment of the present disclosure, the turn-off protection method 200 for the switch unit 103 may further comprise: step 2003, detecting whether the switch unit 103 is turned off, and providing a turn-off indication signal indicating that the switch unit 103 is turned off. In an embodiment, when the first set of switching devices and the second set of switching devices are both turned off, the turn-off indication signal indicates that the switch unit 103 is turned off. In an alternative embodiment, when the application circuit to which the switch unit 103 belongs ends the normal operation process, and the first set of switching devices and the second set of switching devices are both turned off, the turn-off indication signal indicates that the switch unit 103 is "system off". In an alternative embodiment, in step 2001 of the turn-off protection method 200, detecting the freewheeling direction when the switch unit 103 is turned off may comprise detecting the freewheeling direction when the switch unit 103 is "system off". In an alternative embodiment, in step 2002 of the turn-off protection method 200, regulating the freewheeling mode when the switch unit 103 is turned off may comprise regulating the freewheeling mode when the switch unit 103 is "system off".

According to an embodiment of the present disclosure, the turn-off protection method 200 for the switch unit 103 may further comprise: step 2004, setting an effective operation window, wherein, the effective operation window may be set to have a predetermined duration (e.g. $T_{PLS}$) beginning from a transition edge of a system enable signal EN at which the system enable signal EN changes to indicate that the application circuit to which the switch unit 103 belongs stops working (that is to say, in response to the transition edge of the system enable signal EN at which the system enable signal EN changes to indicate that the application circuit comprising the switch unit 103 stops working, setting the effective operation window having the predetermined duration $T_{PLS}$), and executing the steps 2001 and 2002 within the effective operation window.

The advantages of the various embodiments of the present invention are not confined to those described above. These and other advantages of the various embodiments of the present invention will become more apparent upon reading the whole detailed descriptions and studying the various figures of the drawings.

From the foregoing, it will be appreciated that specific embodiments of the present invention have been described herein for purposes of illustration, but that various modifications may be made without deviating from the technology. Many of the elements of one embodiment may be combined with other embodiments in addition to or in lieu of the elements of the other embodiments. Accordingly, the present invention is not limited except as by the appended claims.

What is claimed is:

1. A switch unit turn-off protection circuit for a switch unit, comprising: a freewheeling direction detecting circuit, coupled to a first circuit node and an output node of the switch unit, wherein the switch unit comprises a first set of switching devices coupled between the first circuit node and the output node, and a second set of switching devices coupled between the output node and a second circuit node, and wherein the freewheeling direction detecting circuit is configured to compare a switch node potential at the output node with a first circuit node potential at the first circuit node to provide a first determination signal, and wherein the freewheeling direction detecting circuit is further configured to turn on the first set of switching devices if the switch node potential is higher than the first circuit node potential, and to turn on the second set of switching devices if the switch node potential is lower than the first circuit node potential; and a freewheeling mode regulating circuit, configured to detect a first freewheeling current flowing through the first set of switching devices, and further configured to turn off the first set of switching devices when the first freewheeling current is lower than a first predetermined safe current threshold, and further configured to detect a second freewheeling current flowing through the second set of switching devices, and further configured to turn off the second set of switching devices when the second freewheeling current is lower than a second predetermined safe current threshold;

wherein the freewheeling mode regulating circuit comprises:
(i) a first freewheeling regulating circuit, coupled to the first set of switching devices, and configured to detect the first freewheeling current and to compare the first freewheeling current with the first predetermined safe current threshold to provide a first turn-off signal, wherein when the first freewheeling current is lower than the first predetermined safe current threshold, the switch unit turn-off protection circuit is configured to turn off the first set of switching devices in response to the first turn-off signal; and
(ii) a second freewheeling regulating circuit, coupled to the second set of switching devices, and configured to detect the second freewheeling current and to compare the second freewheeling current with the second predetermined safe current threshold to provide a second turn-off signal, wherein when the second freewheeling current is lower than the second predetermined safe current threshold, the switch unit turn-off protection circuit is configured to turn off the second set of switching devices in response to the second turn-off signal;

and wherein the first freewheeling regulating circuit comprises:
(i) a first current detection amplifier, having a first input terminal coupled to the first circuit node, and a second input terminal coupled to the output node, wherein the first current detection amplifier is configured to detect the first freewheeling current to provide at an output terminal of the first current detection amplifier a first current detection signal indicative of the first freewheeling current; and
(ii) a third regulating comparator, having a first input terminal coupled to the output terminal of the first current detection amplifier to receive the first current detection signal, and a second input terminal configured to receive a first threshold signal indicative of the first predetermined safe current threshold, wherein the third regulating comparator is configured to compare the first current detection signal with the first threshold signal to provide the first turn off signal at an output terminal of the third regulating comparator.

2. The switch unit turn-off protection circuit of claim 1, wherein the freewheeling direction detecting circuit comprises:
a first comparison circuit, having a first input terminal configured to receive a switch node potential indication signal that is indicative of the switch node potential, a second input terminal configured to receive a first node potential indication signal that is indicative of the first circuit node potential, and an output terminal, wherein the first comparison circuit is configured to compare the switch node potential indication signal with the first node potential indication signal to provide the first determination signal.

3. The switch unit turn-off protection circuit of claim 1, wherein the freewheeling direction detecting circuit is coupled to the second circuit node in place of the first circuit node, and wherein the freewheeling direction detecting circuit is configured to compare the switch node potential with a second circuit node potential at the second circuit node to provide a second determination signal, and wherein the freewheeling direction detecting circuit is further configured to turn on the first set of switching devices if the switch node potential is higher than the second circuit node potential, and to turn on the second set of switching devices if the switch node potential is lower than the second circuit node potential.

4. The switch unit turn-off protection circuit of claim 3, wherein the freewheeling direction detecting circuit comprises:
a second comparison circuit, having a first input terminal configured to receive a switch node potential indication signal that is indicative of the switch node potential, a second input terminal configured to receive a second node potential indication signal that is indicative of the second circuit node potential, and an output terminal, wherein the second comparison circuit is configured to compare the switch node potential indication signal with the second node potential indication signal to provide the second determination signal.

5. The switch unit turn-off protection circuit of claim 1, wherein the freewheeling direction detecting circuit and the freewheeling mode regulating circuit are enabled when the switch unit is turned off.

6. The switch unit turn-off protection circuit of claim 1, wherein the freewheeling direction detecting circuit is further coupled to the second circuit node, and wherein the freewheeling direction detecting circuit is further configured to compare the switch node potential with a second circuit node potential at the second circuit node to provide a second determination signal, and wherein instead of turning on the second set of switching devices if the switch node potential is lower than the first circuit node potential, the freewheeling direction detecting circuit is further configured to turn on the second set of switching devices if the switch node potential is lower than the second circuit node potential.

7. The switch unit turn-off protection circuit of claim 6, wherein the freewheeling direction detecting circuit comprises:
a first comparison circuit, having a first input terminal configured to receive a switch node potential indication signal that is indicative of the switch node potential, a second input terminal configured to receive a first node potential indication signal that is indicative of the first circuit node potential, and an output terminal, wherein the first comparison circuit is configured to compare the switch node potential indication signal with the first node potential indication signal to provide the first determination signal; and
a second comparison circuit, having a first input terminal configured to receive the switch node potential indication signal, a second input terminal configured to receive a second node potential indication signal that is indicative of the second circuit node potential, and an output terminal, wherein the second comparison circuit is configured to compare the switch node potential indication signal with the second node potential indication signal to provide the second determination signal.

8. The switch unit turn-off protection circuit of claim 1, wherein the first freewheeling regulating circuit comprises: a first detecting transistor having a first terminal, a second terminal and a control terminal, wherein the first terminal of the first detecting transistor is coupled to the output node, and wherein the control terminal of the first detecting transistor is coupled to a control terminal of the first set of switching devices, and wherein the first detecting transistor is configured to have a first predetermined ratio between an equivalent channel width-to-length ratio of the first set of switching devices and a channel width-to-length ratio of the first detecting transistor, and wherein the first predetermined ratio is positive; a first regulating comparator, having a first input terminal coupled to the second terminal of the first detecting transistor, a second input terminal coupled to the first circuit node, and an output terminal configured to provide the first turn-off signal; and a first current source, coupled to the first input terminal of the first regulating comparator, and configured to adjust a first reference current flowing out of the first input terminal of the first regulating comparator.

9. The switch unit turn-off protection circuit of claim 1, wherein the second freewheeling regulating circuit comprises: a second detecting transistor having a first terminal, a second terminal and a control terminal, wherein the first terminal of the second detecting transistor is coupled to the output node, and wherein the control terminal of the second detecting transistor is coupled to a control terminal of the second set of switching devices, and wherein the second detecting transistor is configured to have a second predetermined ratio between an equivalent channel width-to-length ratio of the second set of switching devices and a channel width-to-length ratio of the second detecting transistor, and wherein the second predetermined ratio is positive; a second regulating comparator, having a first input terminal coupled to the second terminal of the second detecting transistor, a second input terminal coupled to the second circuit node, and an output terminal configured to provide the second turn-off signal; and a second current source, coupled to the first input terminal of the second regulating comparator, and configured to adjust a second reference current flowing into the first input terminal of the second regulating comparator.

10. The switch unit turn-off protection circuit of claim 1, further comprising:
a turn-off detection circuit, configured to detect whether the switch unit is turned off and provide a turn-off indication signal, wherein
the freewheeling direction detecting circuit and the freewheeling mode regulating circuit each having an enable terminal configured to receive the turn-off indication signal, wherein the freewheeling direction detecting circuit and the freewheeling mode regulating circuit are enabled when the turn-off indication signal indicates that the switch unit is turned off, else the freewheeling direction detecting circuit and the freewheeling mode regulating circuit are disabled.

11. The switch unit turn-off protection circuit of claim 10, wherein the turn-off detection circuit is configured to receive a first driving signal, a second driving signal and a system enable signal, and to generate the turn-off indication signal based on the first driving signal, the second driving signal and the system enable signal, and wherein the first driving signal is configured to drive the first set of switching devices, and wherein the second driving signal is configured to drive the second set of switching device, and wherein the system enable signal is configured to indicate whether an application circuit comprising the switch unit is operating.

12. The switch unit turn-off protection circuit of claim 11, wherein when the system enable signal indicates that the application circuit comprising the switch unit stops operating and the first driving signal and the second driving signal respectively control the first set of switching devices and the second set of switching devices to turn off, the turn-off indication signal indicates that the switch unit is turned off.

13. The switch unit turn-off protection circuit of claim 1, further comprising:
a protection window generation circuit, configured to generate a single pulse signal in response to a transition edge of a system enable signal at which the system enable signal transitions to indicate that an application circuit comprising the switch unit stops operating, wherein the single pulse signal has a predetermined pulse width, and wherein the switch unit turn-off protection circuit is enabled during the pulse width of the single pulse signal, and wherein the switch unit turn-off protection circuit is disabled outside the pulse width of the single pulse signal.

14. A turn-off protection method for a switch unit, comprising: detecting a freewheeling direction with a first detecting method when the switch unit is turned off, wherein the first detecting method comprises: comparing a switch node potential at an output node of the switch unit with a first circuit node potential at a first circuit node; when the switch node potential is higher than the first circuit node potential, turning on a first set of switching devices coupled between the first circuit node and the output node; and when the switch node potential is lower than the first circuit node potential, turning on a second set of switching devices coupled between the output node and a second circuit node; and regulating a freewheeling mode when the switch unit is turned off, comprising: detecting a first freewheeling current flowing through the first set of switching devices using a first freewheeling regulating circuit; turning off the first set of switching devices when the first freewheeling current is smaller than a first predetermined safe current threshold; and detecting a second freewheeling current flowing through the second set of switching devices using a second freewheeling regulating circuit; and turning off the second set of switching devices when the second freewheeling current is smaller than the second predetermined safe current threshold;

wherein the first freewheeling regulating circuit comprises:
(i) a first current detection amplifier, having a first input terminal coupled to the first circuit node, and a second input terminal coupled to the output node, wherein the first current detection amplifier is configured to detect the first freewheeling current to provide at an output terminal of the first current detection amplifier a first current detection signal indicative of the first freewheeling current; and
(ii) a third regulating comparator, having a first input terminal coupled to the output terminal of the first current detection amplifier to receive the first current detection signal, and a second input terminal configured to receive a first threshold signal indicative of the first predetermined safe current threshold, wherein the third regulating comparator is configured to compare the first current detection signal with the first threshold signal to provide the first turn off signal at an output terminal of the third regulating comparator;

wherein the second freewheeling regulating circuit comprises:
(i) a second current detection amplifier, having a first input terminal coupled to the second circuit node, and a second input terminal coupled to the output node, wherein the second current detection amplifier is configured to detect the second freewheeling current to provide at an output terminal of the second current detection amplifier a second current detection signal indicative of the second freewheeling current; and
(ii) a fourth regulating comparator, having a first input terminal coupled to the output terminal of the second current detection amplifier to receive the second current detection signal, and a second input terminal configured to receive a second threshold signal indicative of the second predetermined safe current threshold, wherein the fourth regulating comparator is configured to compare the second current detection signal with the second threshold signal to provide a second turn off signal at an output terminal of the fourth regulating comparator.

15. The turn-off protection method of claim 14, wherein:
detecting the freewheeling direction with a second detecting method instead of the first detecting method, and wherein the second detecting method comprises: comparing the switch node potential with a second circuit node potential at the second circuit node; turning on the first set of switching devices when the switch node potential is higher than the second circuit node potential; and turning on the second set of switching devices when the switch node potential is lower than the second circuit node potential.

16. The turn-off protection method of claim 14, further comprising:
detecting the freewheeling direction with a third detecting method instead of the first detecting method, and wherein the third detecting method comprises: comparing the switch node potential respectively with the first circuit node potential and a second circuit node potential at the second circuit node; when the switch node potential is higher than the first circuit node potential, turning on the first set of switching devices; and when the switch node potential is lower than the second circuit node potential, turning on the second set of switching devices.

17. The turn-off protection method of claim 14, further comprising:
setting an effective operation window in response to a transition edge of a system enable signal at which the system enable signal transitions to indicate that an application circuit comprising the switch unit stops operating, and executing the steps of detecting the freewheeling direction and regulating the freewheeling mode when the switch unit is turned off within the effective operation window.

* * * * *